(12) United States Patent
Yamazaki et al.

(10) Patent No.: US 8,138,670 B2
(45) Date of Patent: Mar. 20, 2012

(54) LIGHT-EMITTING DEVICE AND METHOD OF MANUFACTURING THE SAME, AND METHOD OF OPERATING MANUFACTURING APPARATUS

(75) Inventors: Shunpei Yamazaki, Tokyo (JP);
Masakazu Murakami, Kanagawa (JP);
Naomi Kawakami, Kanagawa (JP);
Hisashi Ohtani, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 684 days.

(21) Appl. No.: 12/055,432

(22) Filed: Mar. 26, 2008

(65) Prior Publication Data

US 2009/0001896 A1 Jan. 1, 2009

Related U.S. Application Data

(63) Continuation of application No. 10/370,106, filed on Feb. 21, 2003, now Pat. No. 7,378,126.

(30) Foreign Application Priority Data

Feb. 22, 2002 (JP) .................................. 2002-046816

(51) Int. Cl.
*H01J 1/62* (2006.01)

(52) U.S. Cl. ........................................................ 313/506

(58) Field of Classification Search .......... 313/498–512; 315/169.3, 169.4; 257/40, 79; 428/690
See application file for complete search history.

(56) References Cited

U.S. PATENT DOCUMENTS

| | | | |
|---|---|---|---|
| 4,032,791 A | 6/1977 | Chiola | |
| 4,594,528 A | 6/1986 | Kawakyu | |
| 5,118,986 A | 6/1992 | Ohnuma | |
| 5,427,858 A | 6/1995 | Nakamura | |
| 5,505,985 A | 4/1996 | Nakamura | |
| 5,505,986 A | 4/1996 | Velthaus | |
| 5,525,313 A | 6/1996 | Kawano | |
| 5,635,111 A | 6/1997 | Kawano | |

(Continued)

FOREIGN PATENT DOCUMENTS

CN 1188368 A 7/1998

(Continued)

OTHER PUBLICATIONS

G. Gu et al., "Transparent Organic Light Emitting Devices", Appl. Phys. Lett., vol. 68, May 6, 1996, pp. 2606-2608.

(Continued)

*Primary Examiner* — Peter Macchiarolo
(74) *Attorney, Agent, or Firm* — Fish & Richardson P.C.

(57) ABSTRACT

The inventors have anticipated that there is no problem in employing electron gun deposition as a method of forming a metallic layer on an EL layer of an active matrix light-emitting device because the TFT of the active matrix light-emitting device is disposed below the EL layer. However, since the TFT is extremely sensitive to ionized evaporated particles, the secondary electron, the reflecting electron, and so on generated by the electron gun, while little damage is observed on the EL layer, significant damage is found on the TFT when electron gun deposition is employed. The invention provides an active matrix light-emitting device having superior TFT characteristics (ON current, OFF to current, Vth, S-value, and so on), in which an organic compound layer and a metallic layer (cathode or anode) are formed by means of resistive heating having least influence to the TFT.

22 Claims, 14 Drawing Sheets

U.S. PATENT DOCUMENTS

| | | | | |
|---|---|---|---|---|
| 5,688,551 | A | 11/1997 | Littman | |
| 5,817,366 | A | 10/1998 | Arai | |
| 5,869,134 | A | 2/1999 | Reddy | |
| 5,885,365 | A | 3/1999 | Sugai | |
| 5,902,688 | A | 5/1999 | Antoniadis | |
| 5,904,961 | A | 5/1999 | Tang | |
| 5,965,904 | A | 10/1999 | Ohtani | |
| 5,981,048 | A | 11/1999 | Sugimoto | |
| 6,046,547 | A | 4/2000 | Nishio et al. | |
| 6,049,167 | A | 4/2000 | Onitsuka | |
| 6,087,772 | A | 7/2000 | Ootsuki | |
| 6,118,212 | A | 9/2000 | Nakaya | |
| 6,140,763 | A | 10/2000 | Hung et al. | |
| 6,147,451 | A * | 11/2000 | Shibata et al. | 313/506 |
| 6,179,923 | B1 | 1/2001 | Yamamoto | |
| 6,259,203 | B1 | 7/2001 | Kawamura | |
| 6,284,393 | B1 | 9/2001 | Hosokawa et al. | |
| 6,296,894 | B1 | 10/2001 | Tanabe | |
| 6,337,102 | B1 | 1/2002 | Forrest | |
| 6,342,103 | B1 | 1/2002 | Ramsay | |
| 6,380,672 | B1 * | 4/2002 | Yudasaka | 313/504 |
| 6,384,427 | B1 | 5/2002 | Yamazaki et al. | |
| 6,440,877 | B1 | 8/2002 | Yamazaki | |
| 6,509,109 | B1 | 1/2003 | Nakamura | |
| 6,582,888 | B1 | 6/2003 | Herbst et al. | |
| 6,614,174 | B1 | 9/2003 | Urabe et al. | |
| 6,617,051 | B1 | 9/2003 | Higashi | |
| 6,630,784 | B2 | 10/2003 | Yoneda | |
| 6,646,284 | B2 * | 11/2003 | Yamazaki et al. | 257/40 |
| 6,649,436 | B2 | 11/2003 | Ghosh | |
| 6,664,732 | B2 | 12/2003 | Yamazaki | |
| 6,680,577 | B1 | 1/2004 | Inukai et al. | |
| 6,717,359 | B2 | 4/2004 | Kimura | |
| 6,753,654 | B2 | 6/2004 | Koyama | |
| 6,776,847 | B2 | 8/2004 | Yamazaki | |
| 6,776,880 | B1 | 8/2004 | Yamazaki | |
| 6,797,314 | B2 | 9/2004 | Van Slyke | |
| 6,803,246 | B2 | 10/2004 | Yamazaki | |
| 6,828,727 | B2 | 12/2004 | Yamazaki | |
| 6,830,494 | B1 | 12/2004 | Yamazaki et al. | |
| 6,852,997 | B2 | 2/2005 | Yamazaki | |
| 6,876,350 | B2 | 4/2005 | Koyama | |
| 6,897,608 | B2 | 5/2005 | Yamazaki | |
| 6,946,406 | B2 | 9/2005 | Yamazaki | |
| 6,951,495 | B2 | 10/2005 | Yoneda | |
| 6,965,195 | B2 | 11/2005 | Yamazaki et al. | |
| 6,969,291 | B2 | 11/2005 | Urabe et al. | |
| 7,112,374 | B2 | 9/2006 | Yamazaki et al. | |
| 7,151,015 | B2 * | 12/2006 | Suzawa et al. | 438/149 |
| 7,473,928 | B1 | 1/2009 | Yamazaki et al. | |
| 7,737,924 | B2 | 6/2010 | Koyama | |
| 2001/0003603 | A1 | 6/2001 | Eguchi et al. | |
| 2001/0006827 | A1 | 7/2001 | Yamazaki | |
| 2001/0008121 | A1 | 7/2001 | Tanabe | |
| 2001/0021415 | A1 | 9/2001 | Kido | |
| 2001/0026257 | A1 | 10/2001 | Kimura | |
| 2001/0041392 | A1 * | 11/2001 | Suzawa et al. | 438/149 |
| 2001/0045565 | A1 * | 11/2001 | Yamazaki | 313/504 |
| 2001/0049197 | A1 * | 12/2001 | Yamazaki et al. | 438/689 |
| 2001/0055841 | A1 | 12/2001 | Yamazaki | |
| 2002/0000979 | A1 | 1/2002 | Furuhashi | |
| 2002/0009538 | A1 * | 1/2002 | Arai | 427/66 |
| 2002/0016026 | A1 | 2/2002 | Tsujimura | |
| 2002/0084464 | A1 * | 7/2002 | Yamazaki et al. | 257/89 |
| 2002/0139303 | A1 * | 10/2002 | Yamazaki et al. | 118/719 |
| 2003/0015140 | A1 | 1/2003 | Van Slyke | |
| 2003/0162314 | A1 | 8/2003 | Yamazaki | |
| 2003/0180457 | A1 | 9/2003 | Murakami | |
| 2006/0003099 | A1 | 1/2006 | Jabbour | |

FOREIGN PATENT DOCUMENTS

| | | |
|---|---|---|
| CN | 1221987 | 7/1999 |
| CN | 1 236 825 | 12/1999 |
| EP | 0 845 924 | 6/1998 |
| EP | 0 849 721 A2 | 6/1998 |
| EP | 0 949 696 | 10/1999 |
| EP | 0 977 287 A2 | 2/2000 |
| EP | 1 102 317 | 5/2001 |
| EP | 1 119 221 | 7/2001 |
| EP | 1 119 222 | 7/2001 |
| JP | 02-145384 | 6/1990 |
| JP | 08-055974 | 2/1996 |
| JP | 10-158638 | 6/1998 |
| JP | 10-162959 | 6/1998 |
| JP | 10-168559 | 6/1998 |
| JP | 10-308284 | 11/1998 |
| JP | 11-054287 | 2/1999 |
| JP | 11-251069 | 9/1999 |
| JP | 11-350112 | 12/1999 |
| JP | 2000-104172 | 4/2000 |
| JP | 2000-215982 | 8/2000 |
| JP | 2000-223269 | 8/2000 |
| JP | 2000-268978 | 9/2000 |
| JP | 2001-093844 | 4/2001 |
| JP | 2001-093848 | 4/2001 |
| JP | 2001-148291 | 5/2001 |

OTHER PUBLICATIONS

Chinese Office Action (Application No. 03106309.8), dated Aug. 31, 2007, 9 pages with English translation.

Search Report (Application No. 200300236-7), Oct. 12, 2004, 4 pages.

Written Opinion (Application No. 200300236-7), Oct. 12, 2004, 5 pages.

Office Action (Chinese Patent Application No. 200810174893.6) dated Feb. 12, 2010 (full English translation).

* cited by examiner

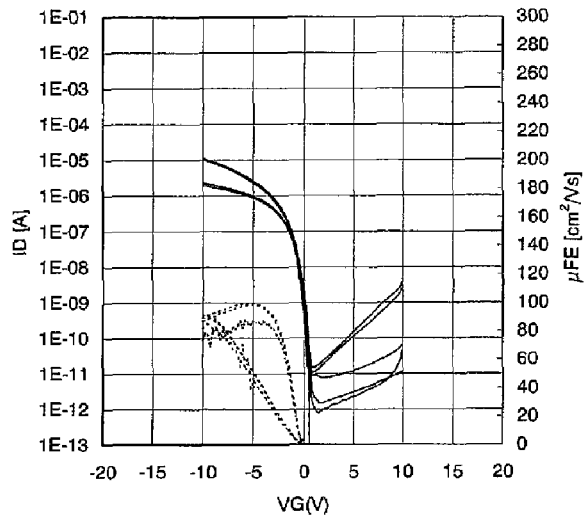
Fig. 1A Electric characteristis of TFT in pixel portion in which cathode is formed by resistive heating.
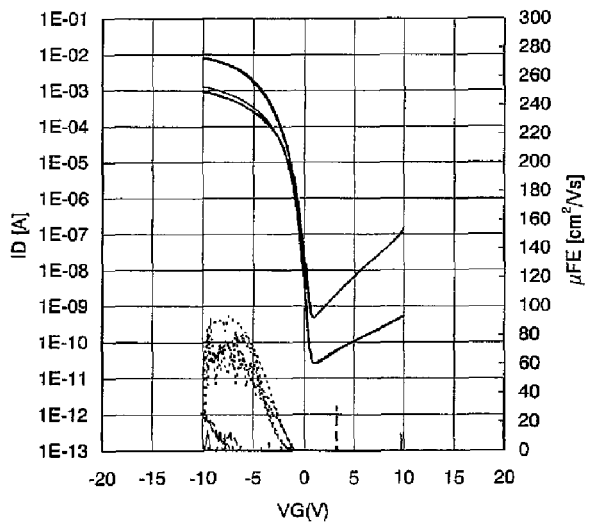
Fig. 1B Electric characteristics of TFT in driver circuit (TFT is overlapped with cathode formed by resistive heating).

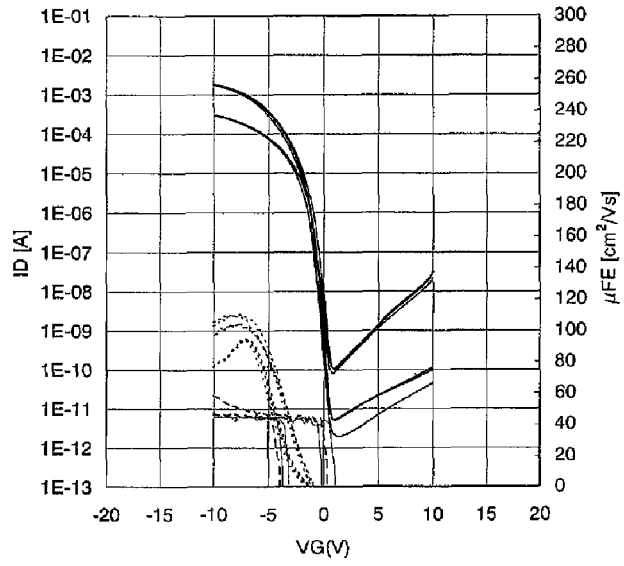
Fig. 2A Electric chanracteristics of TFT in driver circuit (TFT is not overlapped with cathode formed by resistive heating).
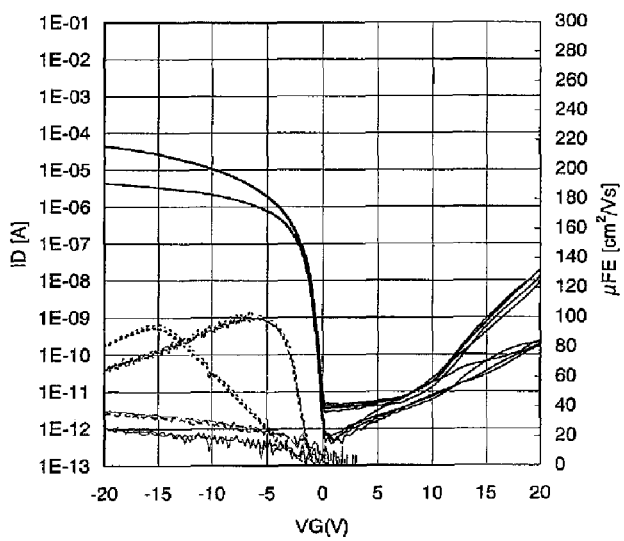
Fig. 2B Electric characteristics of TFT pixel portion measured before forming EL layer.

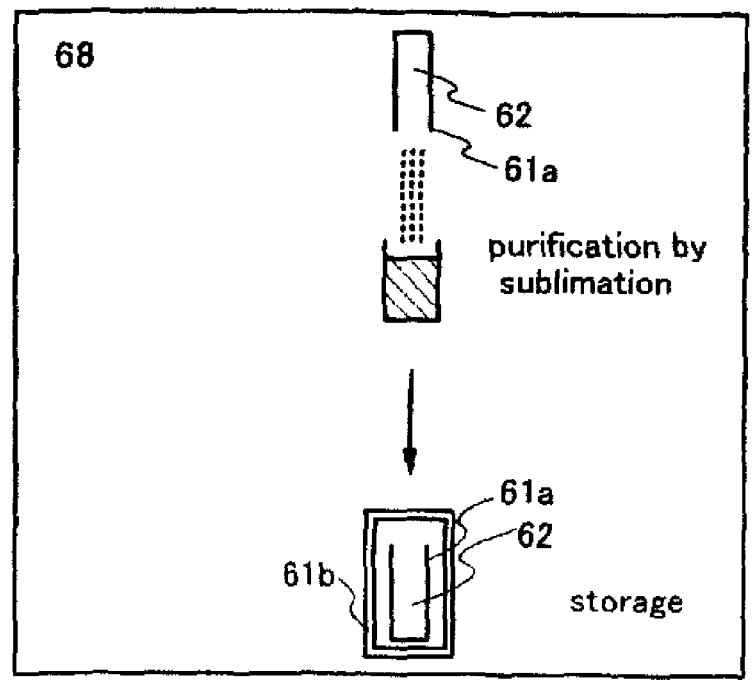
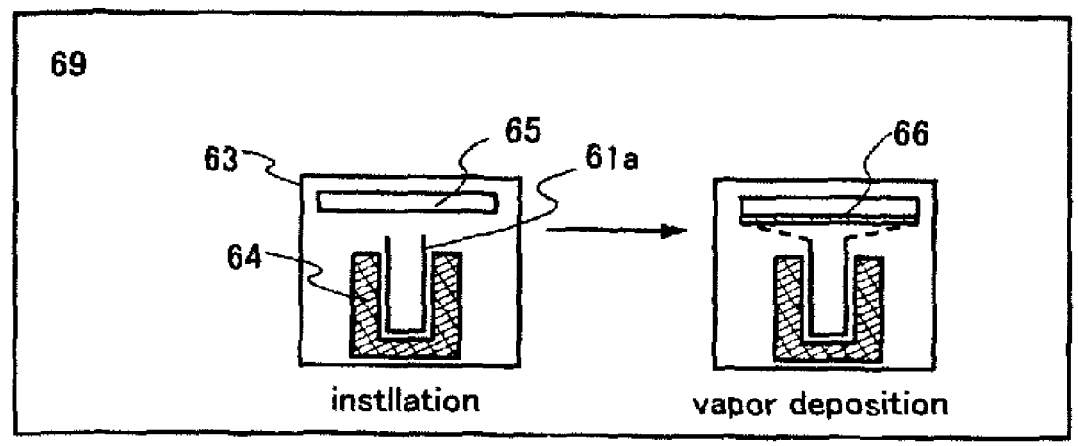
Fig. 6

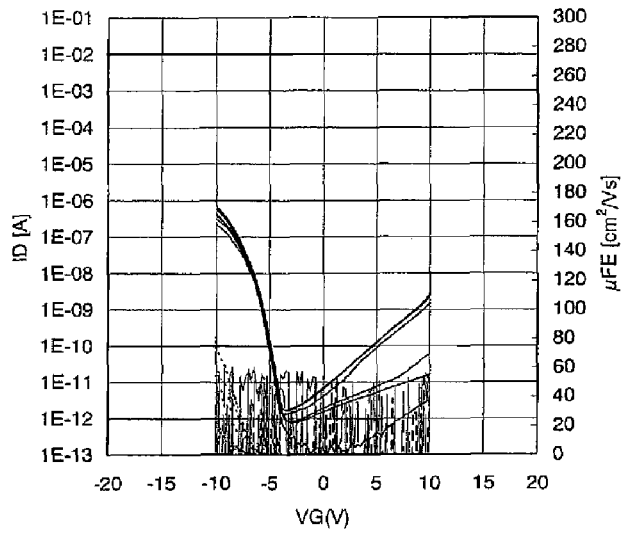

Fig. 13A
Electric characteristics of TFT in pixel portion in which cathode is formed by electron gun deposition.

| calculation parameter | |
|---|---|
| channel type | P |
| L [um] | 83.5 |
| W [um] | 7.0 |
| relative permittivity | 4.1 |
| thickness of oxide film [nm] | 110 |

| calculation result | | |
|---|---|---|
| Ion_2 [A] | 1.00E-16<br>1.00E-16 | 1.00E-16 |
| Ioff_2 [A] | 1.18E-10<br>1.65E-10 | 1.68E-10 |
| Shift_1[V] | -3.969<br>-3.808 | -3.712 |
| Vth [V] | -7.69<br>-7.15 | -7.07 |
| S-value [V/dec] | 0.541<br>0.566 | 0.559 |
| μFE(max) [cm²/Vs] | 40.8<br>50.4 | 67.5 |

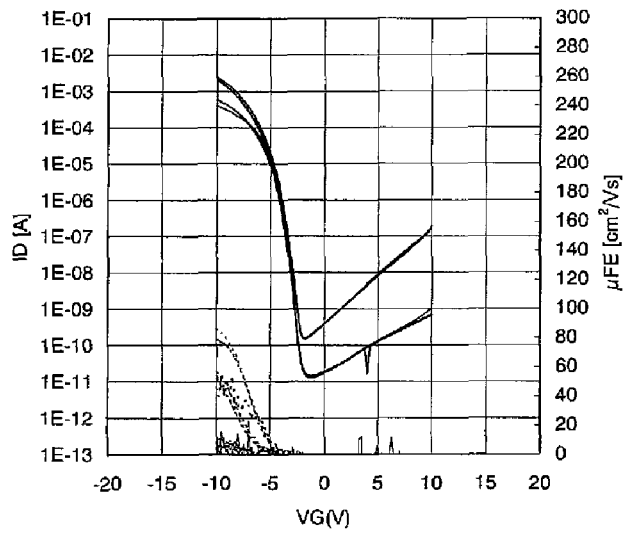

Fig. 13B
Electric characteristics of TFT in driver circuit (TFT is overlapped with cathode is formed by electron gun deposition).

| calculation parameter | |
|---|---|
| channel type | P |
| L [um] | 6.0 |
| W [um] | 410.0 |
| relative permittivity | 4.1 |
| thickness of oxide film [nm] | 110 |

| calculation result | | |
|---|---|---|
| Ion_2 [A] | 1.00E-16<br>1.00E-16 | 1.00E-16 |
| Ioff_2 [A] | 1.22E-08<br>1.07E-08 | 1.20E-08 |
| Shift_1[V] | -1.712<br>-1.706 | -1.758 |
| Vth [V] | -5.73<br>-5.41 | -5.61 |
| S-value [V/dec] | 0.345<br>0.352 | 0.347 |
| μFE(max) [cm²/Vs] | 87.0<br>54.3 | 79.3 |

Electric characteristics of TFT in pixel portion in which cathode is formed by electron gun deposition.

Electric characteristics of TFT in pixel portion measured before forming EL layer.

LIGHT-EMITTING DEVICE AND METHOD OF MANUFACTURING THE SAME, AND METHOD OF OPERATING MANUFACTURING APPARATUS

BACKGROUND OF THE INVENTION

1. Field of the Invention

The present invention relates to a semiconductor device, and, more specifically, to a light-emitting device having a light-emitting element formed on a substrate with an insulated surface and a method of manufacturing the same. The invention also relates to an organic light-emitting module having an IC or the like including a controller mounted on an organic light-emitting panel. In this specification, both the organic light-emitting panel and the organic light-emitting module are referred to as a light-emitting device.

2. Description of the Related Art

In recent years, research on a light-emitting device having a light-emitting element as a self-luminous element has accelerated, and specifically, a light-emitting device employing organic material as EL material has begun to attract people's attention. This light-emitting device is also referred to as an EL display or a light-emitting diode.

The light-emitting element includes a layer containing an organic compound that provides an electro luminescence generated through application of an electric field (hereinafter referred to as EL layer), an anode, and a cathode. The luminescence of the organic compound includes light emission (fluorescent radiation) generated when restoring from a singlet excitation state to the normal state and light emission (phosphorescence) when restoring from a triplet excitation state to the normal state. The light-emitting device manufactured by a film forming device and a method of forming a film according to the invention may be applied to both of the cases employing these light-emissions.

The light-emitting device is characterized by having no limitation in angle of visibility because it is a self-luminous type, in contrast to a liquid crystal display unit. In other words, it is superior to the liquid crystal display when used in the open air, and usages in various ways have been proposed.

The structure of the light-emitting element includes an EL layer interposed between a pair of electrodes, where the EL layer generally has a laminated structure. Typically, a "hole transport layer/light emitting layer/electron transport layer" is employed as the laminated structure of the EL layer. This structure has a very high light-emitting efficiency, and most of the light-emitting devices that are currently under research and development employ this structure.

The a "hole injection layer/hole transport layer/light emitting layer/electron transport layer," laminated structure or a "hole injection layer/hole transport layer/light emitting layer/electron transport layer/electron injection layer" laminated structure may also be employed as the structure of the anode. It is also possible to dope the fluorescent coloring matter to the light-emitting layer. These layers may be formed only from low molecular material or only from high molecular material.

In this specification, all the layers provided between the cathode and the anode are referred to by the generic name EL layer. Therefore, the hole injection layer, the hole transport layer, the light emitting layer, the electron transport layer, and electron injection layer are all included in the EL layer.

In this specification, the light-emitting diode constructed of the cathode, the EL layer, and the anode is referred to as a light-emitting element, which includes a system in which the EL layer is formed between two kinds of striped electrodes arranged so as to be orthogonal with each other (simple matrix system) and a system in which the EL layer is formed between the pixel electrode and the opposite electrode connected to the TFT (Thin Film Transistor) and arranged in a matrix (active matrix system).

The EL material forming the EL layer is generally divided into the low molecular (monomeric) material and the high molecular (polymeric) material. In the case of the low molecular material, the film is formed mainly by vapor deposition.

Publicly known representative vapor deposition techniques include resistive heating in which resistive heaters are disposed around a container containing deposition material therein to heat it indirectly by energizing the resistive heaters so that the deposition material is heated and evaporated, and electron gun deposition (also referred to as EB vapor deposition) in which a beam of electron is irradiated on the deposition material to allow it to evaporate. A method in which a container formed of metal (containing an deposition material therein) is directly energized and heated to allow the deposition material contained therein to evaporate, and a method in which a container formed of a light transmittance material such as quartz (containing an deposition material therein) is radiated and heated by an infrared ray lamp to allow the material contained therein to evaporate.

Since the deposition material formed of an organic compound resolved when irradiated by a beam of electrons because the energy of the beam of electrons is too high, other types of vapor deposition are employed in many cases. In contrast, however, electron gun deposition is still generally employed for depositing a metallic thin film, which is an inorganic material whereof the fusing point is relatively high as a cathode or an anode of the light-emitting diode, because it can easily stabilize the film formation rate.

SUMMARY OF THE INVENTION

Accordingly, it is an object of the invention to complete a light emitting device having TFT characteristics in which an EL layer is formed between the first electrode (cathode, or anode) and the second electrode (anode, or cathode) disposed in a matrix (active matrix system) and connected to a TFT formed on an insulating surface, and, more specifically, to complete a light-emitting device without lowering the characteristics of the TFT during the processes after the TFT is formed (especially during the EL layer forming process, the opposite electrode forming process, the pixel electrode forming process, and so on).

The TFT is an essential element in an active matrix light-emitting device. In addition, since a current to be fed to the light-emitting element is controlled by the TFT in the light-emitting device using the light-emitting element, it is difficult for a TFT formed of amorphous silicon having low field-effect mobility to be used in an active matrix light-emitting device, and thus it is desirable to employ a TFT using a semiconductor film having a crystal structure, typically, polysilicon as a TFT to be connected to the light-emitting element.

In a process of manufacturing the light-emitting device having the light-emitting element, even though a superior TFT could be formed, if impurities get mixed or if the TFT itself becomes damaged in the process after the TFT is formed, the characteristics of the light-emitting device may be lowered, which may lead to a lowering of reliability or the process yield. Especially, the TFT, having a semiconductor film (typically, polysilicon film) of a crystal structure formed on a substrate with an insulated surface such as a glass plate, a quartz plate, and a plastic plate as an active layer has a high driving capability (ON current, $I_{on}$), but is very sensitive. Therefore, the TFT is subjected to the influences of various causes, and consequently the characteristics are subjected to change.

Therefore, in the active matrix light-emitting device, there may be a difference between the characteristics of the TFT measured in the phase when the TFT is formed, and the characteristics of the TFT measured after the light-emitting element is formed over the TFT.

The active matrix light-emitting device includes at least a TFT functioning as a switching element and a TFT supplying a current to the light-emitting element in the respective pixels. The TFT functioning as a switching element requires a low OFF current ($I_{off}$), while the TFT supplying a current to the light-emitting element requires a high driving capability (ON current, $I_{on}$), as well as prevention of deterioration caused by a hot carrier effect and improvement of reliability. The TFT of the driver circuit on the data line side requires a high driving capability (ON current, $I_{on}$), as well as prevention of deterioration due to hot carrier effect and improvement of reliability.

In addition, the TFT supplying a current to the light-emitting element preferably has other superior characteristics in addition to the high driving capability (ON current, $I_{on}$). For example, the more the threshold value (Vth) of the TFT is close to zero, the lower the required driving voltage becomes, and thus reliability may be improved because the lowering of power consumption is achieved and the stress applied to the TFT is reduced. The more the S-value (coefficient of subthreshold) of the TFT is close to the ideal value (60 mV/dacade), the higher the possible speed of the action becomes, and thus the response speed of the animation image improves.

Therefore, it is another object of the invention to provide a TFT having superior characteristics (ON current, OFF current, Vth, S-value, and so on) for use in an active matrix light-emitting device.

The EL material tends to deteriorate quite easily, and is easily oxidized and deteriorated by the presence of oxygen or water. Therefore, a photolithography process cannot be performed after the film has formed, and thus it is necessary to separate the EL material simultaneously with formation of the film through the use of a mask having an opening (hereinafter referred to as deposition mask) in order to pattern the EL material. Therefore, almost all of the sublimed organic EL material is attached to the inner wall of the film-forming chamber or on the attachment proof shield (a protective plate for preventing deposition material from attaching on the inner wall of the film-forming chamber).

In the vapor deposition device in the related art, the space between the substrate and the deposition source is large in order to increase uniformity of the film thickness, and as a consequence, the device itself is increased in size. Since the space between the substrate and the deposition source is large, the speed of film formation is decreased, and thus the period of time required for removing the air in the film-forming chamber increases, which results in a lowering of throughput.

Furthermore, in the vapor deposition device in the related art, since the efficiency of usage of the expensive EL material is as low as about 1% or less, the production cost of the light-emitting device is quite expensive.

Therefore, it is still another object of the invention to provide a vapor deposition device in which the efficiency of usage of the EL material is increased, and satisfactory uniformity and throughput are achieved.

In a method of manufacturing a simple matrix light-emitting device, a TFT is not formed. Therefore, the metallic layer used as a cathode or an anode of the light-emitting diode is formed by electron gun deposition in many cases. However, when the metallic layer is formed on the EL layer by electron gun deposition, there is a problem in that the EL layer becomes damaged by a secondary electron, a reflecting electron, or an incoming X-ray. In order to solve the problem of the secondary electron and the reflecting electron, a method of isolating the electron gun and the substrate by disposing a shield between the deposition source and the substrate, a method of limiting incoming electrons by providing the magnetic field in the vicinity of the substrate, a method of limiting incoming of electrons by applying a negative potential to the substrate, and a method of sucking the electrons by disposing a conducting plate for applying a voltage of positive potential in the vicinity of the deposition source are proposed. These methods provide a solution to the problem described above, and thus the damage to the EL layer may be reduced, and a metallic layer may be formed by electron gun deposition on the EL layer.

The inventors have anticipated that there is no problem in employing electron gun deposition as a method of forming a metallic layer on the EL layer because the TFT is disposed below the ET layer in the active matrix light-emitting device.

However, since the TFT is very sensitive to ionized evaporated particles, the secondary electron, the reflecting electron, and X-ray generated by the electron gun when electron gun deposition is employed, little damage was observed on the EL layer, but significant damages were found on the TFT.

FIGS. 13A and 13B show a result of a measurement of the characteristics of the TFT measured after the cathode is formed by electron gun deposition. FIG. 13A shows electrical characteristics of the p-channel type TFT in the pixel portion, and FIG. 13B shows electrical characteristics of the p-channel type TFT in the driver circuit. In FIG. 13A, the TFT is connected to the cathode via the EL layer, and in FIG. 13B, the cathode is disposed above the TFT and hence superimposed thereon, but the cathode and the TFT are not connected. FIG. 14A shows electrical characteristics of the p-channel type TFT in the driver circuit at the portion where the TFT is not superimposed with the cathode. FIG. 14B shows electrical characteristics of the p-channel type TFT in the pixel portion measured before forming the EL layer.

In the characteristics of the TFT shown in FIG. 13A, a change can be observed and Vth is shifted to a negative value in contrast to FIG. 14B. The S-value is also lowered. In FIG. 13B as well, the Vth is shifted to a negative value, and the S-value is also lowered. On the other hand, in FIG. 14A showing the characteristics of the TFT in which no cathode is formed above the TFT, almost no change is observed.

When forming a film over the substrate partly covered by tea lead (a substrate provided with the TFT) by electron gun deposition, no change was observed in the characteristics of the TFT covered by tea lead. Therefore, it is estimated that the change in the characteristics of the TFT are caused by X-ray.

In this manner, electron gun deposition has a desirable attribute in that inorganic material having a high melting point may be also deposited, while it has an undesirable attribute in that the characteristics of the TFT, especially the S-value of the p-channel type TFT are lowered.

Accordingly, the invention is characterized by an active matrix light-emitting device in which an organic compound layer and a metallic layer (cathode or anode) are formed by means of resistive heating having least influence to the TFT.

The structure of the invention relating to a method of manufacturing a light-emitting device disclosed in this specification is a method of manufacturing a light-emitting device comprising a light-emitting diode having a cathode, an organic compound layer in contact with the cathode, and an anode in contact with the organic compound layer, and a TFT connected to the light-emitting diode, wherein the organic compound layer and the cathode formed of metallic material are formed by means of vapor deposition in which the deposition material is heated by resistive heating.

The results obtained by measuring the characteristics of the TFT after the cathode is formed by means of resistive heating are shown in FIGS. 1A and 1B. FIG. 1A shows the electrical characteristics of the p-channel type TFT in the pixel portion, and FIG. 1B shows the electrical characteristics of the p-channel type TFT in the driver circuit. In FIG. 1A, the TFT is connected to the cathode via the EL layer, while in FIG. 1B, the cathode and the TFT are not connected to each other even though the cathode is disposed above the TFT superimposingly. FIG. 2A shows the electrical characteristics of the p-channel TFT in the driver circuit of the portion in which the TFT is not superimposed on the cathode. FIG. 2B shows the electrical characteristics of the p-channel type TFT in the pixel portion measured before the EL layer is formed.

As shown in FIGS. 1A and 1B, when a cathode is formed by means of resistive heating, little change is found in the characteristics of the TFT in comparison with FIG. 2B.

The cathode may be formed in a laminated layer structure including a plurality of layers. For example, when the cathode is formed into a two-layer structure, the first layer of the cathode that comes into contact with the EL layer is formed by means of resistive heating, and then the second layer is formed by means of electron gun deposition so as to be in contact with the first layer of the cathode. In this case, the first layer formed by means of resistive heating serves as a blocking layer, and prevents the TFT from becoming damaged. Provision of the first layer formed by means of resistive heating may prevent electric charge from being locally concentrated and disperse electric damage during vapor deposition of second layer by means of electron gun deposition.

Another structure of the invention relating to a method of manufacturing a light-emitting device disclosed in this specification is a method of manufacturing a light-emitting device comprising a light-emitting diode having a cathode, an organic compound layer in contact with the cathode, and an anode in contact with the organic compound layer, and a TFT connected to the light-emitting diode, wherein the organic compound layer and a lower layer of the cathode in contact with the organic compound layer are formed by means of vapor deposition in which the deposition material is heated by resistive heating, and the upper layer of the cathode is formed by vapor deposition in which the deposition material formed of metallic material is heated by an electron gun.

The structure that is obtained by the method of manufacturing described above is included in the invention, which is a light-emitting device comprising a light-emitting diode having a cathode, an organic compound layer in contact with the cathode, and an anode in contact with the organic compound layer, and a TFT connected to the light-emitting diode, wherein the cathode is a laminated layer including a layer formed by means of vapor deposition in which the deposition material is formed of a metallic material that is heated by means of resistive heating and a layer formed by vapor deposition in which the deposition material is formed of a metallic material that is heated by an electron gun.

The structure described above is characterized in that the deposition material formed of metallic material is formed of an alloy containing material of low working function, typically, metallic elements belonging to a first group or a second group shown in the periodic table.

In the invention, it is also applicable to form the organic compound layer on the cathode, and then the anode on the organic compound layer. In this case, the invention provides a light-emitting device comprising a light-emitting diode having a cathode, an organic compound layer in contact with the cathode, and an anode in contact with the organic compound layer, and a TFT connected to the light-emitting diode, wherein the anode is a laminated layer including a layer formed by means of vapor deposition in which the deposition material formed of metallic material is heated by resistive heating and a layer formed by means of vapor deposition in which the deposition material formed of metallic material is heated by the electron gun.

In the structure described above, the deposition material that is formed of a metallic material is a conductive material including one or a plurality of element selected from materials of large working function, typically from Pt, Cr, W, Ni, Zn, Sn, and In.

The conceivable processes during which impurities such as oxygen or water may get mixed into the EL material or metallic material to be deposited include the process of setting the EL material or metallic material into the vapor deposition device before vapor deposition, and the depositing process.

Normally, a container to store the EL material is a brownish glass bottle, which is closed by a plastic lid (cap). It is also conceivable that the hermeticity of the container for storing the EL material is not sufficient.

In the related art, when forming a film by vapor deposition, a predetermined amount of deposition material contained in the container (glass bottle) is taken out and transferred to a container disposed at the position opposed to the film-forming object in the vapor deposition device (typically, a melting pot or a vapor deposition boat), and in this step, impurities may get mixed in this transferring step. In other words, oxygen, water, or some other impurities that may cause deterioration of light-emitting element may be mixed into the EL material during this step.

When transferring the material from the glass bottle into the container, for example, the operator may perform such a transferring operation by hand in a pretreatment chamber equipped with gloves in the vapor deposition device. However, when the pretreatment chamber is equipped with gloves, the transferring operation cannot be performed in vacuumized environment, and thus the operation has to be performed under atmospheric pressure. Even if the operation were performed in a nitrogen atmosphere, it is difficult to reduce water and oxygen in the pretreatment chamber to the allowable level. Using a robot is also conceivable, but since the deposition material is in the powdered form, it is difficult to manufacture a robot that can transfer such powdered material. Therefore, it has been difficult to establish a consistent closed system in which the process from the step of forming the EL layer on the lower electrode to the step of forming an upper electrode is fully automated while avoiding impurities from getting mixed into the EL material.

Accordingly, the invention realizes a manufacturing system in which the EL material or the metallic material is stored directly in the container that is to be installed in the vapor deposition device without using the conventional container, typically a brownish glass bottle as a container for storing the EL material and vapor deposition is performed after transportation thereof so that impurities are prevented from getting mixed into the high-purity deposition material. When storing the EL deposition material directly, it is also possible not to store a part of the obtained deposition material, but to sublimate and purify the material directly into the container that is to be installed in the vapor disposition device. According to the invention, further purification of the deposition material may be accommodated. It is also possible to store metallic material directly in the container to be installed in the vapor disposition device, and to perform vapor deposition by means of resistive heating.

The operation to store the deposition material directly in the container to be installed in the vapor deposition device is preferably ordered by a manufacture of the light-emitting device that uses the vapor deposition device to a manufacturer or seller of the deposition material.

Even though a high-purity EL material is provided by the manufacturer of the material, when the manufacturer of the light-emitting device transfers the EL material as in the related art, there is a possibility that impurities will get mixed therein, and thus the purification of the EL material cannot be maintained, or the purification of the EL material is limited. However, according to the invention, when the manufacturer of the light-emitting device and the manufacturer of the material cooperate to reduce the possibility of mixing the impurities in the EL material, the very high-purity EL material that can be obtained from the manufacturer of the material may be maintained and the manufacturer of the light-emitting device can perform vapor deposition without lowering its purity.

The structure of the invention disclosed in this specification is a method of operating a manufacturing apparatus including the steps of sealing a first container containing organic material or metallic material in a second container, disposing a substrate in the manufacturing apparatus having a vacuum pumping unit, introducing the second container, taking the first container out from the second container and disposing it in place, heating the first container by resistive heating to allow vapor deposition on the substrate.

The structure described above is characterized in that the organic material is sublimated and purified on the inner wall of the first container. The structure described above is also characterized in that the metallic material is a conductive material that may serve as a cathode or as an anode of the light-emitting diode.

In the vapor deposition device employing resistive heating in the related art, disadvantageously, the film-forming rate is liable to be unstable in comparison with electron gun deposition.

Therefore, in order to increase the efficiency of utilization of the deposition material and to provide a vapor deposition device that is superior in uniformity and in throughput, according to the invention, the distance d between the substrate and the deposition source is reduced to typically 20 cm or less during vapor deposition, so that the efficiency of utilization and the throughput of the deposition material are significantly improved. Reducing the distance d between the substrate and the deposition source may decrease the size of the film-forming chamber. Decreasing the size of the film-forming chamber may reduce the capacity thereof, and thus the period of time required for forming a vacuum and the total quantity of impurities existing in the film-forming chamber may be reduced, which may allow prevention of impurities such as water and oxygen from getting mixed into the high-purity EL material.

The method of operating the manufacturing apparatus described above is characterized in that the distance between the substrate and the container is not more than 20 cm so that vapor deposition is performed over the substrate.

In addition, the invention is characterized in that the mechanism for rotating the substrate in the film-forming chamber and a mechanism for moving the deposition source are provided, and rotation of the substrate and movement of the deposition source are simultaneously performed during vacuum deposition, so that the film formation superior in uniformity of thickness may be achieved.

The method of operating the manufacturing apparatus is characterized in that the substrate is rotated and the first container is moved during vapor deposition.

The invention also provides a method of manufacturing a light-emitting device including a first step of storing deposition material of organic material or of metallic material in a container, a second step of disposing a substrate in a vapor deposition device and installing the container so as to opposed to the substrate, and a third step of heating the container installed in the vapor deposition device by means of resistive heating and performing vapor deposition onto the substrate with the distance between the substrate and the container set to 20 cm or less.

The structure described above is characterized in that the first step of storing deposition material of an organic material or a metallic material in the container is performed by the material manufacturer.

The structure described above is characterized in that the substrate is rotated and the container is moved during vapor deposition. In the structure described above, the organic material may be directly sublimated and purified into the container when being stored.

The structure described above is characterized in that the substrate is formed with a TFT and a first electrode is connected to the TFT, and in that the third step includes the steps of forming an organic compound layer of organic material in contact with the first electrode by means of resistive heating and forming a second electrode of metallic material in contact with the organic compound layer by resistive heating, so that a light-emitting diode having the first electrode, the organic compound layer, and the second electrode is manufactured.

In the light-emitting device of the invention, a method of driving the display is not specifically limited, and a dot sequential drive system, a line sequential drive system, or a plane sequential drive system may be employed. Typically, the line sequential drive system is employed, and a time division gradation sequence drive system or a pulse-surface-area modulation drive system may be utilized as needed. The video signals to be supplied into a source line of the light-emitting device may be any one of analog signals and digital signals, and the driver circuit may be designed corresponding to the video signal as needed.

In the light-emitting device of the invention, the structure of the pixel is not specifically limited, and a storage capacitor or a memory (SRAM, DRAM, and so on) may be formed in one pixel. A structure in which a plurality of TFT or various circuits (such as a current mirror circuit) may be integrated in one pixel is also applicable.

BRIEF DESCRIPTION OF THE DRAWINGS

FIGS. 1A and 1B are drawings showing TFT characteristics in the case where a cathode is formed by means of resistive heating;

FIGS. 2A and 2B are drawings showing the characteristics of the TFT;

FIG. 6 is a drawing showing the third embodiment;

FIGS. 13A and 13B are drawings showing the characteristics of the TFT when the cathode is formed by means of electron gun (comparative example)

DESCRIPTION OF THE PREFERRED EMBODIMENTS

Preferred embodiments of the invention will be described below.

First Embodiment

Referring now to FIGS. 3A, 3B, 4A, and 4B a process of manufacturing an active matrix type light-emitting device including a pixel portion and a driver circuit on the same substrate and a light-emitting element will be described as an example.

Figure 3A:
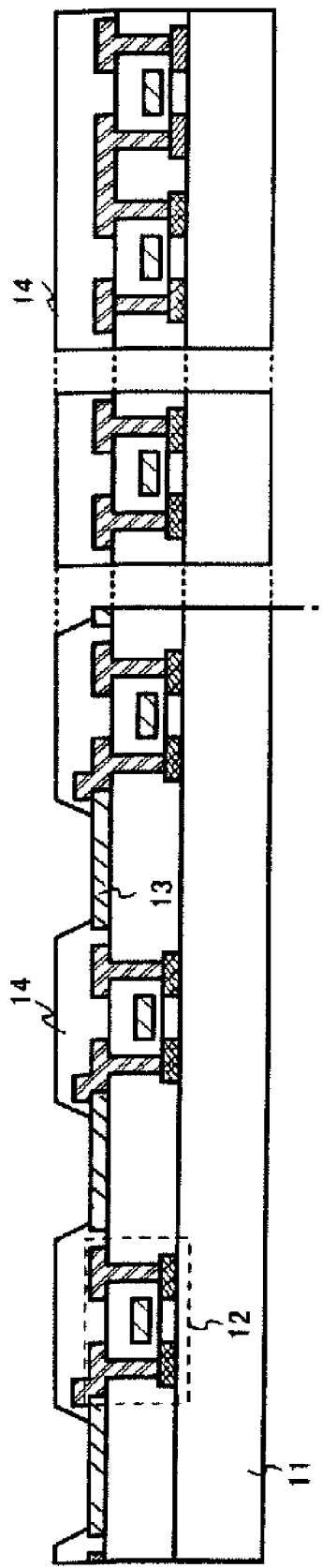
FIGS. 3A and 3B are cross sectional views of the invention (first embodiment)

As shown in FIG. 3A, a thin film transistor (hereinafter referred to as TFT) 12 is formed on a substrate 11 having an insulating surface according to a known manufacturing method. The pixel portion 10a is provided with an n-channel type TFT and a p-channel type TFT. In the figure, only the p-channel type TFT supplying a current to a light-emitting element is shown. The TFT for supplying a current to the light-emitting element may be any one of the n-channel type TFT and the p-channel type TFT. A driver circuit 10b to be provided around the pixel portion is formed with the n-channel type TFT, the p-channel type TFT, or a CMOS circuit, which is a complementary combination thereof. Here, an example in which an anode 13 formed of a transparent oxide conductive coating (ITO (Indium Oxide-Tin Oxide Alloy), Indium Oxide-Zinc Oxide Alloy (In2O3-ZnO), Zinc Oxide (ZnO) and so on) is formed in matrix, and a wiring to be connected with an active layer of the TFT is formed is shown. Subsequently, an insulating film 14 of inorganic insulating material or organic insulating material for coating the end of the anode 13 is formed.

Figure 3B:
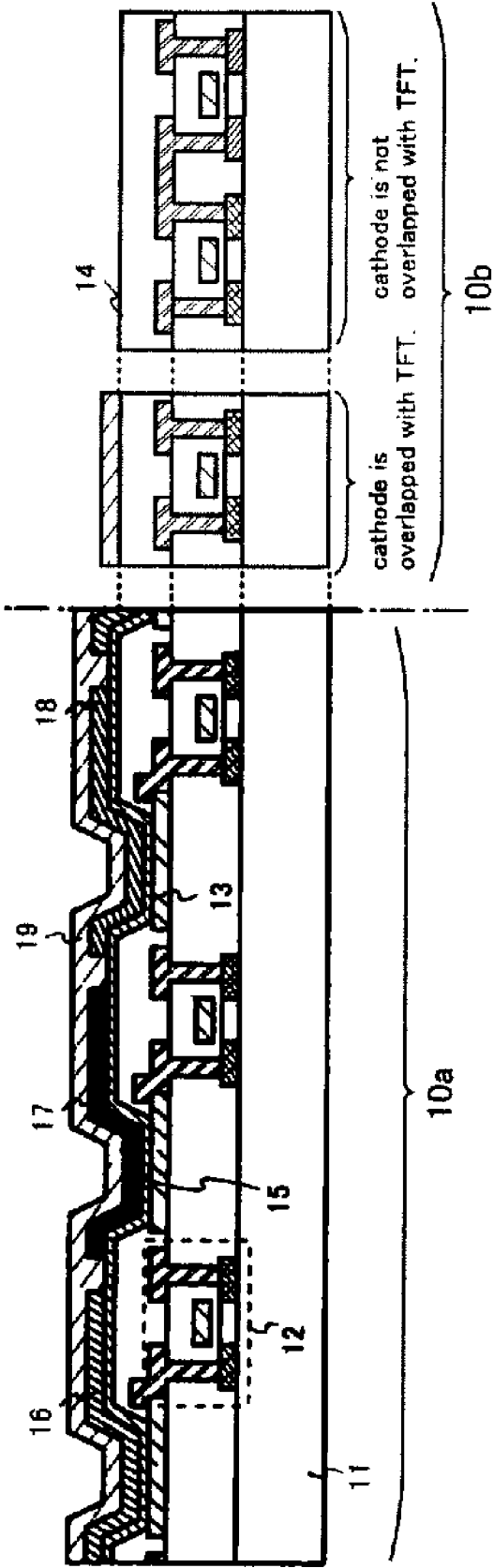

Then, as shown in FIG. 3B, an organic compound layer (EL layer) for forming the light-emitting element is formed.

In a first place, cleaning of the anode 13 is performed as a preprocess. The surface of the anode is cleaned by irradiating Ultraviolet light in a vacuum, or by an oxygen plasma treatment. As an oxidation treatment, Ultraviolet light must simply be irradiated in an atmosphere including oxygen while heating to 100 to 120° C., which is effective in the case where the anode is an oxide such as ITO. As a heating treatment, heating at a temperature not less than 50° C., which is a temperature the substrate can resist in a vacuum, more preferably between 65° C. and 150° C., must simply be performed, which removes impurities such as oxygen and water attached on the substrate, or impurities such as oxygen and water in a film formed over the substrate. Especially, since the EL material is subjected to deterioration due to impurities such as oxygen and water, it is effective to heat in a vacuum before vapor deposition.

Subsequently, the deposition source is transported to the film-forming chamber provided with a deposition source while avoiding exposure to the air, and a hole transport layer, a hole injection layer, or a light emitting layer is formed as a laminated first layer of organic compound layer on the anode 13 as appropriate. Here, the deposition source is heated by resistive heating to deposit to form a hole injection layer 15, a light-emitting layer (R) 16, a light emitting layer (G) 17, and a light-emitting layer (B) 18. The light-emitting layer (R) emits a red light, and the light-emitting layer (G) emits green light, and the light-emitting layer (B) emits blue light.

Subsequently, the cathode 19 is formed by heating and depositing the deposition source by resistive heating. Forming the cathode 19 by resistive heating allows completion of the light-emitting element without changing the characteristics of the TFT. In the pixel portion, little change is seen in the characteristics when comparing FIG. 1A that shows the characteristics of the TFT after forming the cathode by resistive heating and FIG. 2B that shows the characteristics of the TFT before forming the EL layer. Threshold values (Vth), which are obtained by measuring three arbitrary TFTs, are −0.44 (V), −0.51(V) and −0.59V, S-values are 0.214 (V/dec), 0.287 (V/dec) and 0.26 (V/dec) as indicated in FIG. 1A, which are excellent.

Material preferable for forming the cathode 19 is metal of small working function (typically, metallic element belonging the first group or the second group in the periodic table) or alloy containing these metallic element. The smaller the working function becomes, the more the light-emitting efficiency improves, and thus alloy material containing Li (lithium), which is one of alkali metals, is preferable as material to be used for the cathode. The cathode also serves as a wiring commonly for all the pixels, and has a terminal electrode at the input terminal via a connecting wiring. Therefore, as shown in FIG. 3B, there may be the case some TFTs are superimposed on the cathode 19 in the driver circuit. The result of measurement of the characteristics of the TFTs that superimpose on the cathode 19 is shown in FIG. 1B.

When the cathode is formed by electron gun deposition other than resistive heating, the electric characteristics are changed not only in the TFTs in the pixel portion, but also in the TFTs overlapping with the cathode in the driver circuit. The electric characteristics of the TFT in the case where the cathode is formed by electron gun deposition are shown in FIGS. 13A, 13B, 14A and 14B. The Vths obtained when measuring arbitrary three TFTs in the pixel portions are −7.69 (V), −7.07(V) and −7.15(V) respectively, and the S-values are 0.541 (V/dec), 0.559 (V/dec) and 0.566 (V/dec) as shown in FIG. 13A.

Subsequently, it is preferable to isolate the light-emitting element completely from the outside by encapsulating it by a protective film, a sealing plate, or a sealing tin so as to prevent substance that may promote deterioration of the EL layer due to oxidation such as water or oxygen from entering from the outside. It is also applicable to use desiccating agent.

Then, the FPC (flexible print circuit) is adhered on the respective electrodes of an I/O terminal by means of an anisotropic conductive material. The anisotropic conductive material includes resin and conductive particles of several tens to several hundreds μm in diameter plated with Au and the like on the surface, and electrically connected the respective electrodes of the I/O terminal and the wiring formed in the FPC by conductive particles.

If necessary, the optical film such as a circular light-deflection plate constructed of a deflection plate and a wave plate may be provided, or the IC chip may be mounted.

The module type active matrix light-emitting device with the FPC connected is completed in the process described thus far.

Figure 4A:
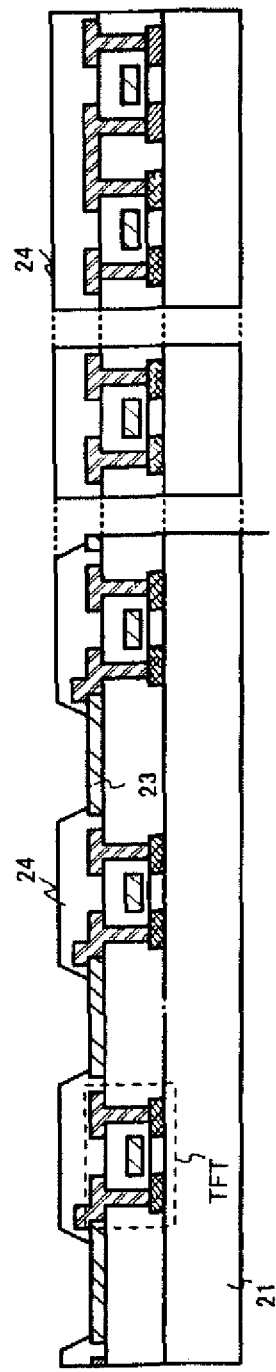
FIGS. 4A to 4C are cross sectional views of the invention (first embodiment)
Figure 4B:
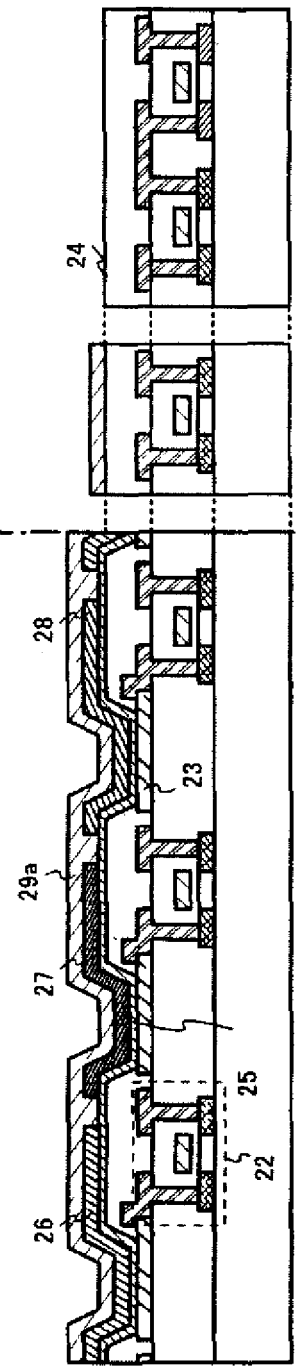
Figure 4C:
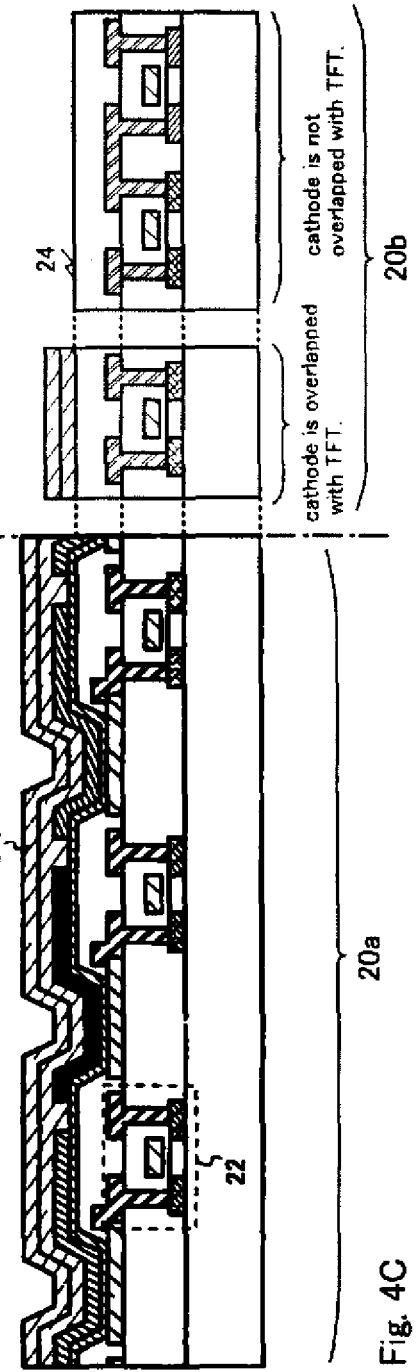

The cathode may be formed into a laminated structure including two or more layers. An example in which the cathode is formed into two-layer structure, and the first layer of the cathode that comes into contact with the EL layer is formed by resistive heating, and the second layer that comes into contact with the first layer of the cathode is formed by electron gun deposition is shown in FIGS. 4A to 4C. The part of the process that is the same as in FIGS. 3A and 3B will not be described in detail here for the sake of simplification.

A TFT 22, an anode 23, and an insulating film 24 are formed on a substrate 21 having an insulating surface as in the case of FIG. 3A (See FIG. 4A).

Subsequently, by resistive heating, a hole injection layer 25, a light-emitting layer (R) 26, a light-emitting layer (G) 27, a light-emitting layer (B) 28 are formed as described in conjunction with FIG. 3B. Then, a cathode (lower layer) 29a is formed by resistive heating (See FIG. 4B). The thickness of the cathode (lower layer) 29a may be determined as appropriate within the range that does not cause any damage in the TFT during vapor deposition by means of electron gun deposition that will be performed later.

As a next step, a cathode (upper layer) 29b is formed in a pixel portion 20a and in a driver circuit portion 20b by electron gun deposition as shown in FIG. 4C. Although the cathodes 29a, 29b in this example are formed by depositing the same materials, they may be of different materials.

When the cathode has a laminated structure as described above, the first layer that is formed by resistive heating serves as a blocking layer, and prevents the TFT from becoming damaged. By provision of the first layer formed by resistive heating, electric charge may be prevented from being locally concentrated during vapor deposition of the second layer by electron gun deposition and may disperse the electric damage.

The process that follows is the same as the method of manufacturing the module type, active matrix light-emitting device described above, and will not be described here.

In the example described above, the anode is a transparent conductive film and the anode, the organic compound layer, and the cathode are laminated sequentially in order. However, the invention is not limited to such a laminated structure, and thus the lamination may be formed sequentially in order of the cathode, the organic compound layer, and the anode, or alternatively, the anode is formed of a metallic layer, and the lamination may be formed sequentially in order of the anode, the organic compound layer, and a cathode having a translucency. After all, the invention is characterized in that the cathode or the anode formed of a metallic layer is deposited by means of resistive heating when forming the light-emitting element over the TFT.

Further, although a top gate type TFT is shown in this example as one of the structures of the TFT, it is also possible to apply the invention irrespective of the TFT structure. For example, it may also be applied to a bottom gate type (inverse stagger type) TFT or the normal stagger type TFT.

Second Embodiment

Figure 5A:
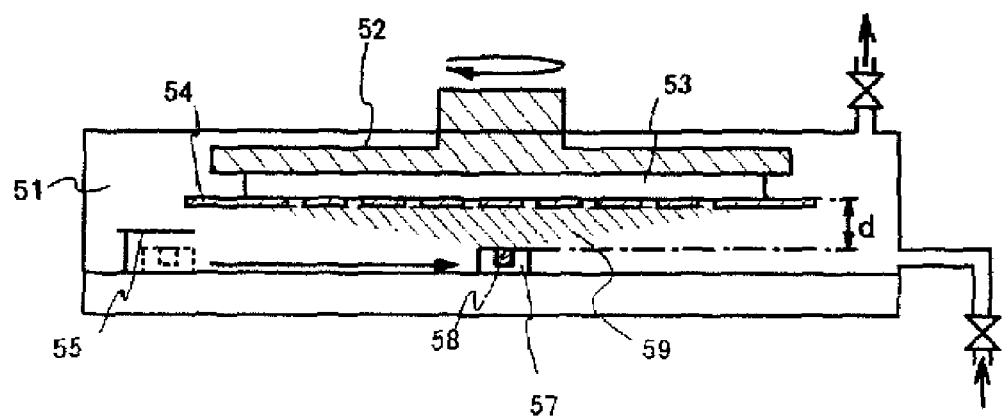
FIGS. 5A and 5B are drawings showing a manufacturing apparatus (second embodiment)

A vapor deposition device shown in FIGS. 5A and 5B will be described now. FIG. 5A is a cross sectional view, and FIG. 5B is a top view.

Figure 5B:
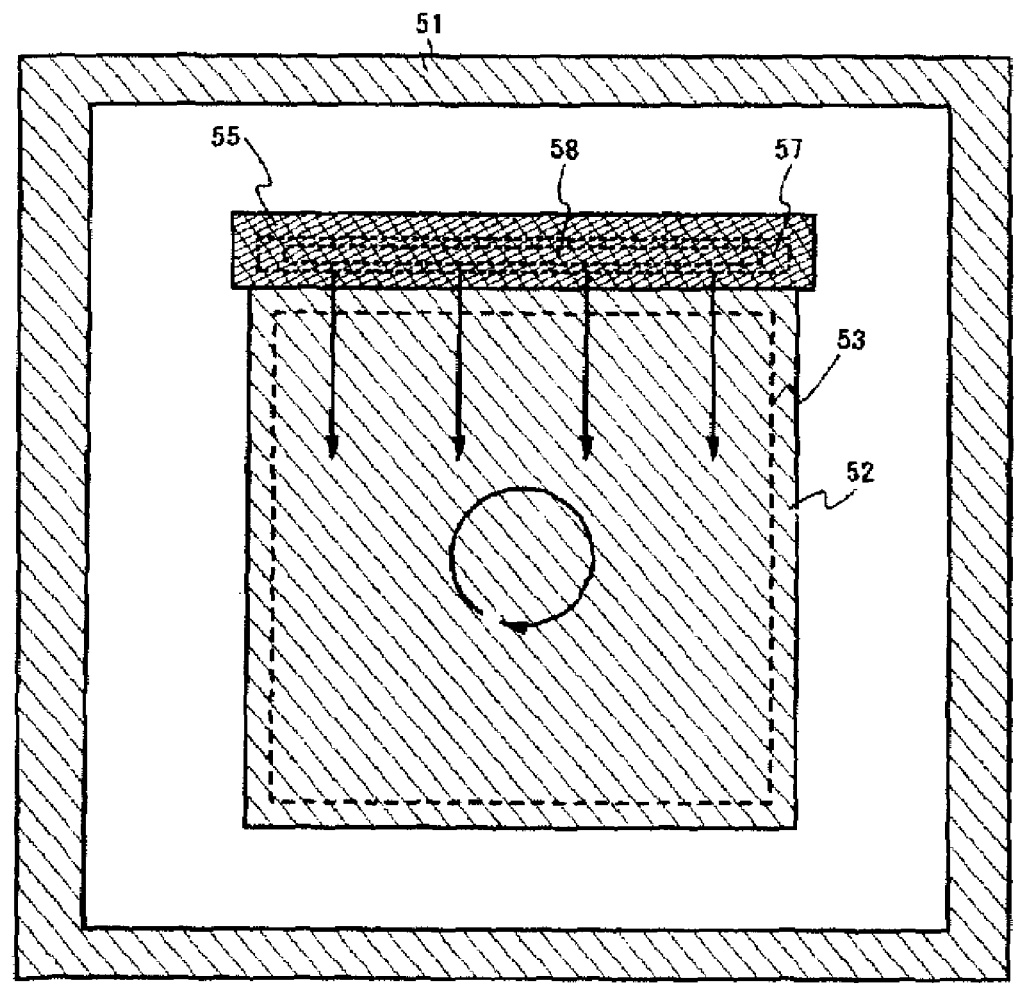

In FIGS. 5A and 5B, reference numeral 51 is a film-forming chamber, reference numeral 52 designates a substrate holder, reference numeral 53 designates a substrate, reference numeral 54 designates a deposition mask, reference numeral 55 designates a deposition shield (deposition shutter), reference numeral 57 designates a deposition source holder, reference numeral 58 designates deposition material, and reference numeral 59 designates evaporated deposition material.

Vapor deposition is performed in the film-forming chamber 51 that is vacuumized to $5 \times 10^{-3}$ Torr (0.665 Pa) or less, more preferably to $10^{-4}$ to $10^{-6}$ Pa. When deposition, the deposition material is already evaporated by resistive heating, and is splashed toward the substrate 53 when the shutter (not shown) is opened during vapor deposition. The evaporating material 59 splashes upward, and is selectively deposited over the substrate 53 through the opening formed on the deposition mask 54.

In the vapor deposition device described above, the deposition source holder includes a melting pot, a heater disposed outside the melting pot via a burning member, a heat insulating layer provided outside the heater, a outer cylinder accommodating these members, a cooling pipe laid around the outside the outer cylinder, and a shutter unit for opening and closing the opening of the outer cylinder including the opening of the melting pot. In this specification, the melting pot is a cylindrical container having a relatively large opening formed of sintered BN, composite sintered BN/AlN, quartz, or graphite, which is tolerable to high temperature, high pressure, and pressure reduction.

It is preferable to adapt the vapor deposition device in such a manner that the film-forming speed may be adjusted by controlling the heater provided on the deposition source holder 52 by a microcomputer.

In the vapor deposition device shown in FIGS. 5A and 5B, the distance d between the substrate 53 and the deposition source holder 57 is reduced to the value typically not more than 20 cm, more preferably between 5 cm and 15 cm, to significantly increase the efficiency of usage of the deposition material and the throughput.

In addition, the substrate holder 52 is provided with a mechanism for rotating the substrate 53. The deposition source holder 57 is provided with a mechanism that can move in the film-forming chamber 51 in the direction X or Y while maintaining the horizontal state.

The vapor deposition device shown in FIGS. 5A and 5B is characterized in that formation of film that is superior in uniformity of thickness may be realized by carrying out the rotation of the substrate 53 and the movement of the deposition source holder 57 simultaneously during vapor deposition.

In the vapor deposition device employing resistive heating of the related art, the film-forming rate tends to be unstable in comparison with electron gun deposition. However, the vapor deposition device shown in FIGS. 5A and 5B is superior in uniformity and in throughput.

It is also applicable to provide the deposition shutter on the movable deposition source holder 57. The organic compound placed in a single deposition holder need not be only one, but may be plural.

Since the distance d between the substrate 53 and the deposition source holder 57 is reduced to the value typically not more than 20 cm, more preferably between 5 cm and 15 cm, the deposition mask 54 may also be heated. Therefore, the deposition mask 54 is preferably formed of metallic material having low coefficient of heat expansion and thus resists heat deformation (for example, metal having high melting point, such as tungsten, tantalum, chrome, nickel, and molybdenum, or alloy including these elements, or materials such as stainless, Inconel and Hastelloy). In order to cool the heated deposition mask, the deposition mask may be provided with a mechanism for allowing cooling medium (cooling water, cooling gas) to circulate.

The deposition mask 54 is used when forming the deposited film selectively, and thus it is not especially necessary when forming the deposited film on the entire surface.

The substrate holder 52 is provided with a permanent magnet so as to fix the deposition mask formed of meal by a magnetic force, and the substrate 53 to be interposed therebetween is also fixedly supported. Although an example in which the deposition mask is in close contact with the substrate 53 is shown here, it is also possible to provide and fix the substrate holder and the deposition mask holder at some distance.

The film-forming chamber is connected with the vacuumable process chamber for forming a vacuum in the film-forming chamber. The vacuumable process chamber is provided with a magnetically levitated turbo molecular pump, a cryopump or a drive pump. Accordingly, the final degree of vacuum in the transportation chamber of $10^{-5}$ to $10^{-6}$ Pa is achieved, and the reverse splash of the impurities from the pump and the exhaust system may be controlled. Inert gas such as nitrogen and rare gas are introduced for preventing the impurities from being introduced into the device. Such gas to be introduced into the device is highly purified by a gas-purifying device before being introduced into the device. Therefore, it is required to provide a gas-purifying device for allowing gas to be introduced into the film-forming device after being highly purified. Accordingly, the impurities such as oxygen or water or other impurities contained in gas may be removed in advance, and thus such impurities may be prevented from being introduced into the device.

It is also possible to clean the film-forming chamber 51 by providing a plasma-generating unit therein, generating plasma in the film-forming chamber without the substrate disposed therein, and vaporizing deposited substance attached on the inner wall of the film-forming chamber, the attachment proof shield, or the deposition mask to exhaust out of the film-forming chamber. In this manner, the interior of the film-forming chamber may be cleaned at the time of maintenance service without exposing it to atmospheric air. The organic compound vaporized during cleaning may be collected by the exhaust system (vacuum pump) and reused.

This embodiment may be combined as desired with the first embodiment. With the vapor deposition device shown in FIGS. 5A and 5B, uniformity of film on the surface of the substrate may be improved, and the cathode or the anode of the organic compound layer or metallic layer may be formed by resistive heating.

Third Embodiment

FIGS. 6A and 6B are an explanatory drawing illustrating a manufacturing system of the invention.

In FIGS. 6A and 6B, reference numeral 61a designates a first container (melting pot), and reference numeral 61b designates a second container of isolating the first container from atmospheric air to protect the same from being contaminated. Reference numeral 62 designates EL material in the highly purified powdered state. Reference numeral 63 designates a vacuumable process chamber, numeral 64 designates a heating unit, numeral 65 designates a deposited object, and numeral 66 designates a deposited film. Reference numeral 68 designates a material manufacturer that manufactures and purifies organic compound material as deposition material (typically a raw material retailer), reference numeral 69 designates a light-emitting device manufacturer having a vapor deposition device that is manufacturer of the light-emitting device (typically a manufacturing factory).

A flow of a manufacturing system of the invention will be described below.

In a first place, the light-emitting device manufacturer 69 makes an order 60 to the material manufacturer 68. The material manufacturer 68 prepares the first container and the second container according to the order 60. The material manufacture purifies or stores super high-purity EL material 62 in the first container 61a in a clean chamber while paying sufficient attention so that impurities (oxygen, water, etc.) are not get mixed. Subsequently, the material manufacturer 68 preferably seals the first container 61a with a second container 61b in the clean chamber so that no superfluous impurities attaches the inside or the outside of the first container. When sealing, the inside of the second container 61b is preferably vacuumized or filled with inert gas. The first container 61a and the second container 62b are preferably cleaned before purifying or storing super high-purity EL material 62.

In the invention, the first container 61a is placed in the chamber as it is when performing vapor deposition later. Although the second container 61b may be a packing film having a performance of a barrier for blocking oxygen or water from getting mixed, it is preferable to employ a solid container being cylindrical shape or box shape, and having a light-blocking effect in order to be capable of being taken out automatically.

Subsequently, the first container 61a is transported 67 from the material manufacturer 68 to the light-emitting device manufacturer 69 in the state of being sealed in the second container 61b.

Then, the first container 61a is introduced to the vacuumable process chamber 63 in the state of being sealed in the second container 61b. The process chamber 63 is a vapor deposition chamber having the heating unit 64 and a substrate holder (not shown) disposed therein. After the process chamber 63 is vacuumized and the clean state in which oxygen and water are minimized is achieved, the first container 61a is taken out from the second container 61b and installed in the heating unit 64 without releasing the vacuumized state so that the disposition source may be prepared. The deposited object (substrate in this case) 65 is installed so as to oppose to the first container 61a.

Subsequently, the disposition material is heated by the heating unit 64 by means of resistive heating to form the deposited film 66 on the surface of the deposited object 65 provided so as to oppose to the deposition source. The deposited film 66 thus obtained does not contain impurities, and hence the light-emitting diode completed by using this deposited film 66 realizes high reliability and high intensity.

As described above, the first container 61a is introduced into the vacuumable process chamber 63 without being exposed to atmospheric air only once and allows vapor deposition while maintaining purity of the deposition material 62 as it was when being stored by the material manufacturer. By storing the EL material 62 directly into the first container 61a by the material manufacturer, only the required quantity of material must simply be provided to the light-emitting device manufacturer, so that the relatively expensive EL material may be utilized effectively.

Although the depositing method by resistive heating in the related art is low in efficiency of the material, there is a method of increasing the efficiency of usage as shown below. After the first vapor deposition is performed in a state in which new EL material is placed in the melting pot during maintenance service of the vapor deposition device, there remains residual material that could not be deposited. Therefore, when performing the vapor deposition for the next time, the EL material is added to the residual material, and such replenishment is repeated until the next maintenance service so that the efficiency of usage may be improved in vapor deposition from here onward. However, in this method, residual material may cause contamination. In addition, since replenishment is made by the operator, oxygen or water may get mixed to the deposition material and hence the purity of the deposition material may be lowered. The melting pot that was used several times for vapor deposition is to be abandoned at the time of maintenance service. In order to prevent contamination due to impurities, it is conceivable to place new EL material into the melting pot for every vapor deposition and to abandon the melting pot after every vapor deposition, but it increases the manufacturing cost as a consequence.

The glass bottle that has been used for storing the deposition material in the related art may be eliminated and the process to transfer the deposition material from the glass bottle into the melting pot, which may prevent the impurities from getting mixed by employing the aforesaid manufacturing system. In addition, the throughput is also increased.

The invention realizes the fully automated manufacturing system in which the throughput is increased, and a consistent closed system that may prevent the impurities from getting mixed into the deposition material 62 purified by the material manufacturer 68.

Although the EL material has been taken as an example above, the metallic layer that is employed as a cathode or an anode may be deposited by vapor deposition by means of resistive heating in the invention. Forming the cathode by resistive heating may form the light-emitting element without changing the electric characteristics of the TFT 12 (ON current, OFF current, Vth, S-value, and so on).

The deposited film with metallic material may also be formed in the same manner by storing the metallic material in the first container in advance, introducing the first container into the vapor deposition device as it is, and evaporating the material by resistive heating.

The present embodiment may be combined as desired with the first embodiment or with the second embodiment. When the vapor deposition device shown in the second embodiment is used, the metallic layer that serves as the cathode or the anode may be formed uniformly even by means of resistive heating.

Fourth Embodiment

While an example in which the top gate type TFT (more specifically, a plainer type TFT) is used as the TFT 12, 22 is shown in the first embodiment, the TFT 72 is used instead of TFT 12, 22 in this embodiment. A TFT 72 used in this embodiment is a bottom gate type TFT (more specifically, an inverted stagger type TFT), which may be manufactured according to the known manufacturing process.

Figure 7A:
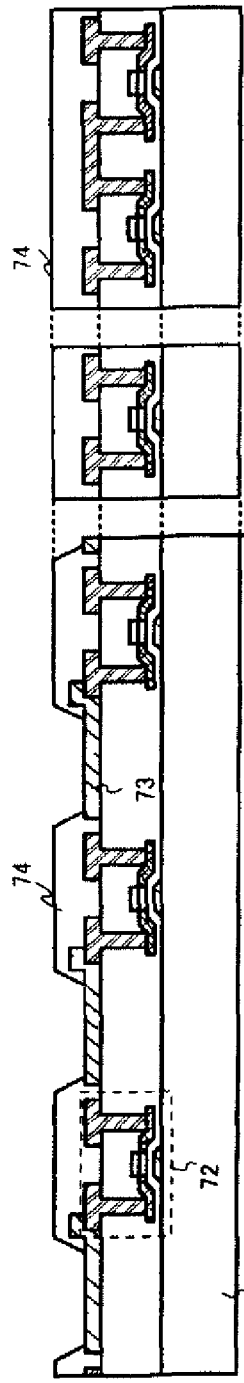
FIGS. 7A to 7C are drawings showing the fourth embodiment.

As shown in FIG. 7A, the bottom gate type TFT 72 is formed on a substrate 71 having an insulated surface according to the known manufacturing process. In the example shown here, an anode 73 formed of metallic layer (conductive material containing one or a plurality of elements selected from Pt, Cr, W, Ni, Zn, Sn, and In) is formed in matrix after the TFT is formed.

Subsequently, an insulating film 74 of inorganic insulating material or of organic insulating material is formed so as to cover the ends of the anode 73.

Figure 7B:
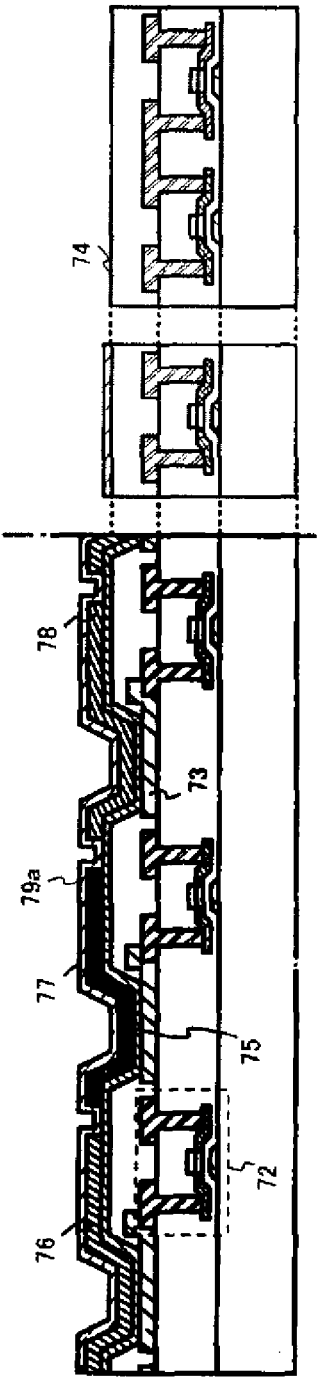

Then, as shown in FIG. 7B, a film of an organic component layer (EL layer) constituting the light-emitting element is formed. It is transported into the film-forming chamber provided with the deposition source, where a laminated layer including a hole transport layer, a hole injection layer, or a light-emitting layer as appropriate is formed as a first layer of organic compound on the anode 73. In this case, the deposition source is heated by resistive heating for performing vapor deposition, and then a hole injection layer 75, a light-emitting layer (R) 76, a light-emitting layer (G) 77, and a light-emitting layer (B) 78 are formed.

Subsequently, a cathode 79a as the lower layer is deposited by heating the deposition source by resistive hating. Forming the cathode 79a by resistive heating may complete the light-emitting element without changing the electric characteristics of the TFT. The cathode 79a as a lower layer is preferably formed of an extremely thin metal film (a film formed by co-deposition of an alloy such as MgAg, MgIn, AlLi, CaN, or elements belonging to the first or second group of the periodic table and aluminum) or a laminated layer thereof.

Figure 7C:
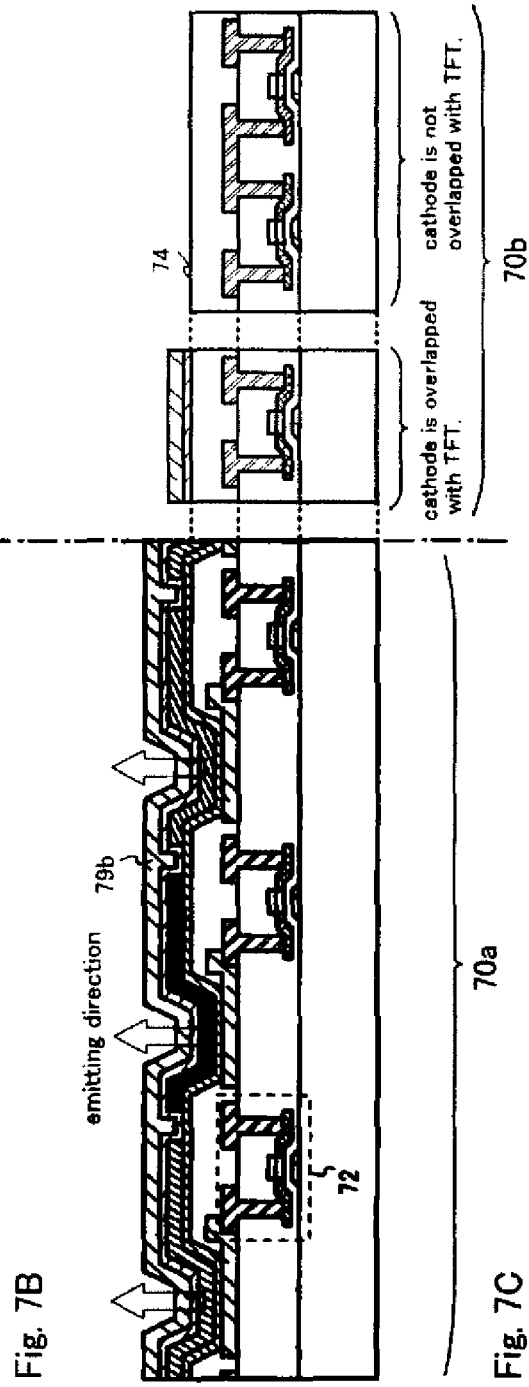

Then, the cathode 79b as the upper layer is formed in a pixel portion 70a and in a driver circuit portion 70b (See FIG. 7C). The cathode 79b as the upper layer may be formed of a transparent oxide conductive coating (ITO (Indium Oxide-Tin Oxide Alloy), Indium Oxide-Zinc Oxide Alloy (In2O3-ZnO), Zinc Oxide (ZnO) and so on). Since the laminated structure in FIG. 7C shows the case in which the light is emitted in the direction indicated by an arrow in the figure (in the case where the emitted light is passed through the cathode), it is preferable to employ translucent conductive material for the cathode.

Since the process from this onward is the same as the method of manufacturing the module type active matrix light-emitting device described in conjunction with the first embodiment, it will not be described here.

The present embodiment may be combined with the first embodiment, the second embodiment, and the third embodiment as desired.

The invention constructed as described thus far will be described further in detail via the following examples.

Example 1

In this example, a multi-chamber system manufacturing apparatus in which the process of manufacturing to the upper electrode is fully automated shown in FIG. 8 will be described.

Figure 8:
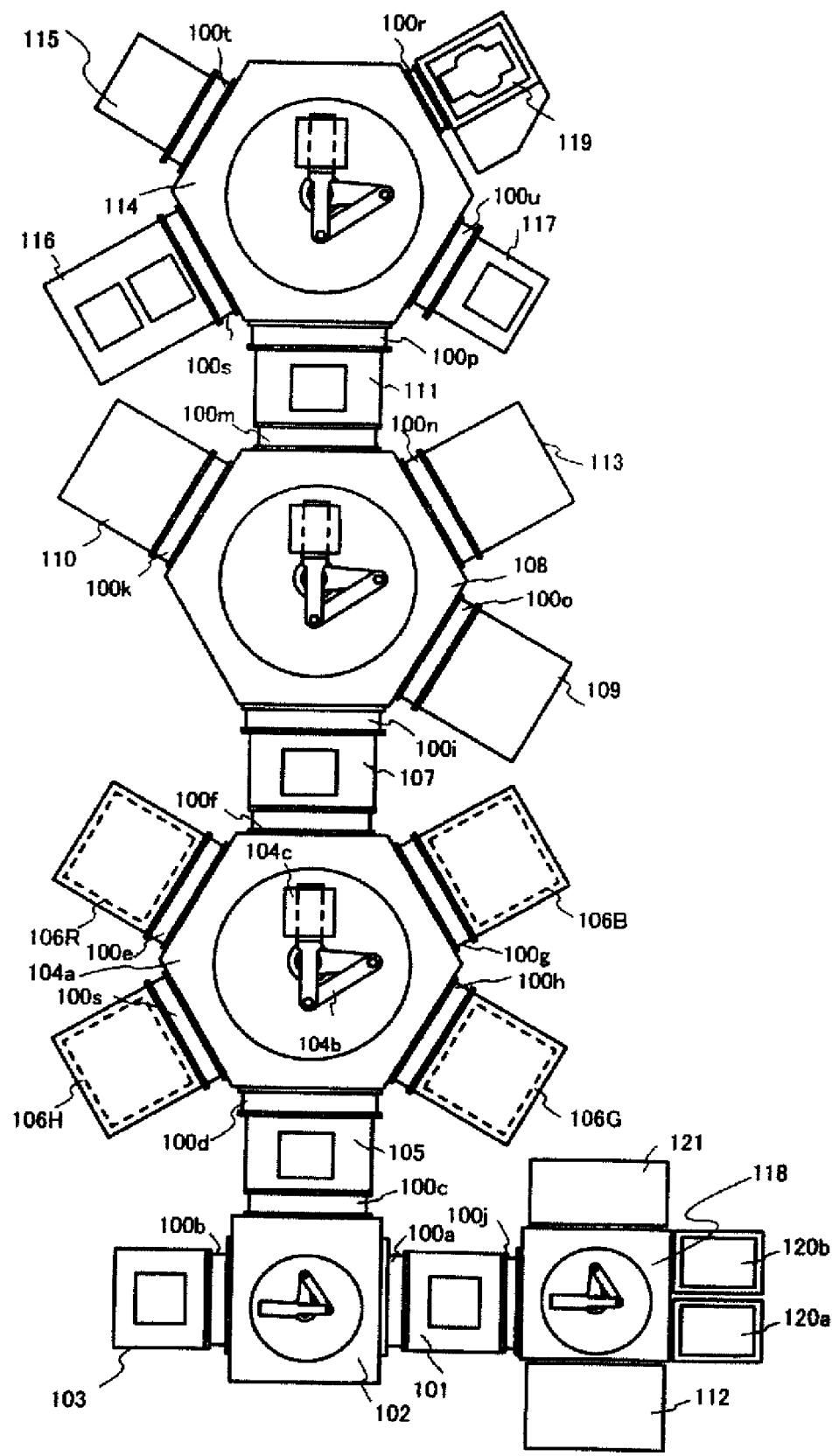
FIG. 8 is a drawing showing the manufacturing apparatus (example 1)

In FIG. 8, reference numerals 100a-100k, 100m-100p and 100r-100u designate gates, numeral 101 designates a charging chamber, numeral 119 designates a take-out chamber, numerals 102, 104a, 108, 114 and 118 designate transporting chambers, numerals 105, 107 and 111 designate passing chambers, numerals 106R, 106B, 106G, 109, 110, 112, 113 designate film-forming chambers, numeral 103 designates a preprocess chamber, numeral 117 designates a sealed substrate loading chamber, numeral 115 designates a dispenser chamber, numeral 116 designates a sealing chamber, numerals 120a and 120b designate cassette chambers, and numeral 121 designates a tray mounting stage.

Following is a procedure for transporting a substrate provided with the TFT 12 and the anode 13 in advance into the manufacturing apparatus shown in FIG. 8 and forming a laminated structure shown in FIG. 3B.

In a first place, the substrate provided with the TFT 12 and the anode 13 is set in the cassette chamber 120a or in the cassette chamber 120b. When the substrate is a large substrate (for example, 300 mm×360 mm), it is set in the cassette chamber 120b. On the other hand, when it is a normal substrate (for example, 127 mm×127 mm), it is transported into the tray mounting stage 121 and the several substrates on the tray (for example, 300 mm×360 mm) is mounted.

Subsequently, the substrate is transported from the transporting chamber 118 provided with a substrate transporting mechanism into the charging chamber 101.

The charging chamber 101 is connected to the vacuumable process chamber, and thus it is preferable to restore to the atmospheric pressure by introducing inert gas after vacuum was formed. Then the substrate is transported into the transporting chamber 102 connected to the charging chamber 101. The transporting chamber is vacuumized and maintained in the vacuumized state so that existence of water or oxygen in the transporting chamber is minimized.

The transporting chamber 102 is connected to the vacuumable process chamber for forming vacuum in the transporting chamber. The vacuumable process chamber is provided with a magnetic levitation turbo molecular pump, a cryopump, or a dry pump. Accordingly, the final degree of vacuum in the transportation chamber of 10-5 to 10-6 Pa is achieved, and the reverse splash of the impurities from the pump and the exhaust system may be controlled. Inert gas such as nitrogen and rare gas are introduced for preventing the impurities from being introduced into the device. Such gas to be introduced into the device is highly purified by a gas-purifying device before being introduced into the device. Therefore, it is required to provide a gas-purifying device for allowing gas to be introduced into the film-forming device after being highly purified. Accordingly, the impurities such as oxygen or water or other impurities contained in gas may be removed in advance, and thus such impurities may be prevented from being introduced into the device.

Preferably, annealing for deaeration is performed in vacuum in order to remove water or other gases contained in the substrate, and thus the substrate is transported into the preprocess chamber 103 connected to the transporting chamber 102 for annealing therein. If it is necessary to clean the surface of the anode, the substrate is transported into the preprocess chamber 103 connected to the transporting chamber 102 for cleaning therein.

It is also possible to form a high-polymer organic compound layer all over the anode. The film-forming chamber 112 is used for forming a high-polymer organic compound layer. In this example, poly(ethylene dioxythiophene/poly (styrene sodiumsulfonate) solution (PEDOT/PSS) that acts as the hole injection layer 15 is formed on the whole surface. When forming the organic compound layer in the film-forming chamber 112 by a spin coat method, an ink-jet method, or a spraying method, the substrate is set with the film-forming surfaces up under the atmospheric pressure. In this example, the passing chamber 105 is provided with a substrate inverting mechanism, and thus the substrate is inverted as needed. After the film is formed with solution, preferably, the substrate is transported into the preprocess chamber 103, and heating process is performed in vacuum to evaporate water. Although the high-polymer hole injection layer 15 is formed in this example, a hole injection layer of low-polymer organic material may be formed by vapor deposition through resistive heating. It is not necessarily required to form the hole injection layer 15.

Then, after a substrate 104c is transported from the transporting chamber 102 to the passing chamber 105 without exposing the substrate to the atmospheric air, the substrate 104c is transported into the transporting chamber 104, and then is transported into the film-forming chamber 106R by a transporting mechanism 104b, where the EL layer 16 emitting red light is formed on the anode 13 as needed. In this case, the EL layer 16 is formed by vapor deposition by means of resistive heating. The film-forming surface of the substrate is turned down in the passing chamber 105 before setting in the film-forming chamber 106R. The film-forming chamber is preferably vacuumized before the substrate is transported therein.

For example, the vapor deposition is performed in the film-forming chamber 106R vacuumized to not more than 5×10-3 Torr (0.665 Pa), more preferably, to 10-4 to 10-6 Pa. When vapor deposition is taken place, the organic compound has already vaporized by resistive heating in advance, and it splashes toward the substrate when the shutter (not shown) is opened for deposition. Evaporated organic compound splashes upward, and is deposited on the substrate through an opening (not shown) formed on a metal mask (not shown). When performing vapor deposition, the temperature (T1) of the substrate is kept in the range of 50 to 200° C., more preferably to 65-150° C. by the means for heating the substrate.

In this example, the melting pots in which the deposition material is already stored by the material manufacturer are set in the film-forming chambers 106R, 106B, 106G, 110. The melting pots are preferably set without being exposed to atmospheric air, and preferably introduced into the film-forming chamber in a state of being sealed in the second container when being transported by the manufacturer of material. Preferably, a chamber having a vacuum-pumping unit is provided in connection with the film-forming chamber 106R, so that the melting pot is taken out from the second container in vacuum or in inert gas atmosphere and set into the film-forming chamber. Accordingly, the melting pot and the EL material stored in the melting pot may be prevented from being contaminated.

In this case, in order to make the film in full color, film-formation is performed in the film-forming chambers 106G and 106B in sequence after the film is formed in the film-forming chamber 106R, so that the organic compound layers 16-18 emitting red, green and blue lights are formed as appropriate.

When the hole injection layer 15 and the desired EL layer 16-18 are obtained on the anode 13, the substrate is transported from the transporting chamber 104a to the passing chamber 107 without exposing the substrate to the atmospheric air, and then the substrate is transported in turn from the passing chamber 107 to the transporting chamber 108 without exposing the substrate to the atmospheric air.

Subsequently, when the substrate is transported into the film-forming chamber 110 by the transporting mechanism provided in the transporting chamber 108, where the cathode 19 of metallic layer is formed by vapor deposition through resistive heating as appropriate. The film-forming chamber 110 here is a vapor deposition device using Li and Al as a deposition source for vapor deposition by means of resistive heating.

The light-emitting diode of laminated structure as shown in FIG. 3A is formed according to the process described thus far.

Subsequently, the substrate is transported from the transporting chamber 108 into the film-forming chamber 113 without being exposed to atmospheric air, where a protective film formed of a silicon nitride film or a silicon nitride-oxide film is formed. In this case, the apparatus is a spatter device provided with a target of silicon, a target of silicon oxide, or a target of silicon nitride in the film-forming chamber 113. For example, the silicon nitride film may be formed by using the target of silicon and making the atmosphere in the film-forming chamber into the nitride atmosphere or the atmosphere containing nitride and argon.

Then, the substrate formed with the light-emitting diode is transported from the transporting chamber 108 to the passing chamber 111 and from the passing chamber 111 to the transporting chamber 114 without being exposed to the atmospheric air.

The substrate formed with the light-emitting diode is transported form the transporting chamber 114 to the sealing chamber 116. The sealing chamber 116 is preferably prepared with a sealing substrate provided with sealing material.

The sealing substrate is set into a sealing substrate loading chamber 117a from the outside. In order to remove the impurities such as water, it is preferable to perform annealing in vacuum in advance, for example, to perform annealing in the sealing substrate loading chamber 117. When forming the sealing material on the sealing substrate, the transporting chamber 108 is set to the atmospheric pressure, and then the sealing substrate is transported from the sealing substrate loading chamber into the dispenser chamber 115, where the sealing material for adhering to the substrate formed with the light-emitting diode is formed, and the sealing substrate formed with the sealing material is transported into the sealing chamber 116.

In order to deaerate the substrate formed with the light-emitting diode, annealing is performed in vacuum or in inert gas atmosphere, and then the sealing substrate formed with the sealing material and the substrate formed with the light-emitting diode are adhered with each other. The hermetically closed space is filled with hydrogen or inert gas. In this example, the sealing material is formed on the sealing substrate. However, it is not limited thereto, and the sealing material may be formed on the substrate provided with the light-emitting diode.

Subsequently, the UV-light is irradiated on the pair of adhered substrates by a UV-light irradiating mechanism provided in the sealing chamber 116 to cure the sealing material. In this case, ultraviolet curing resin is used as sealing material, but it is not limited thereto as far as it is an adhesive agent.

Then the pair of adhered substrates is transported from the sealing chamber 116 to the transporting chamber 114, and from the transporting chamber 114 to the take-out chamber 119 for taking them out.

By using the manufacturing apparatus shown in FIG. 8, the light-emitting diode are protected completely from being exposed to the outside air until it is sealed into the hermetically closed space, highly reliable light-emitting device may be achieved. Since the melting pot accommodating the deposition material in advance must only be set, the setting of the deposition material may be automated. The transferring chamber 114 is repeatedly converted between the vacuumized state and the nitride atmosphere under atmospheric pressure, while the transferring chambers 102, 104a, 108 are preferably maintained in the vacuumized state in a constant basis.

It is also possible to employ a film-forming device of in-line system.

Following is a procedure for transporting the substrate having the TFT and the anode thereon in advance into the manufacturing apparatus shown in FIG. 8, and forming the laminated structure shown in FIG. 7C In the same manner as the case in which the laminated structure shown in FIG. 3A is formed, the substrate provided with the TFT and the anode 73 in advance is set in the cassette chamber 120a or the cassette chamber 120b.

Subsequently, the substrate is transported from the transporting chamber 118 provided with a substrate transporting mechanism into the charging chamber 101. Then the substrate is transported into the transporting chamber 102 connected to the charging chamber 101.

Preferably, annealing for deaeration is performed in vacuum in order to remove water or other gases contained in the substrate, and thus the substrate is transported into the preprocess chamber 103 connected to the transporting chamber 102 for annealing therein. If it is necessary to clean the surface of the anode, the substrate is transported into the preprocess chamber 103 connected to the transporting chamber 102 for cleaning therein.

It is also possible to form a high-polymer organic compound layer all over the anode. The film-forming chamber 112 is used for forming a high-polymer organic compound layer. For example, poly(ethylene dioxythiophene/poly(styrene sodiumsulfonate) solution (PEDOT/PSS) that acts as the hole injection layer 75 may be formed on the whole surface. When forming the organic compound layer in the film-forming chamber 112 by a spin coat method, an ink-jet method, or a spraying method, the substrate is set with the film-formed surfaces up under the atmospheric pressure. The passing chamber 105 is provided with a substrate inverting mechanism, and thus the substrate is inverted as needed. After the film is formed with solution, preferably, the substrate is transported into the preprocess chamber 103, and heating process is performed in vacuum to evaporate medium component.

Then, after the substrate 104c is transported from the transporting chamber 102 into the passing chamber 105 without exposing the substrate to the atmospheric air, the substrate 104c is transported into the transporting chamber 104, and then is transported into the film-forming chamber 106R by the transporting mechanism 104b, where the EL layer 16 emitting red light is formed on the anode 73 as needed. In this case, the EL layer 16 is formed by vapor deposition by means of resistive heating.

In this case, in order to make the film in full color, film-formation is performed in the film-forming chambers 106G and 106B in sequence after the film is formed in the film-forming chamber 106R, so that the organic compound layers 76-78 emitting red, green and blue lights are formed as appropriate.

When the hole injection layer 75 and the desired EL layer 76-78 are obtained on the anode 73, the substrate is transported from the transporting chamber 104a to the passing chamber 107 without exposing the substrate to the atmospheric air, and then the substrate is transported in turn from the passing chamber 107 to the transporting chamber 108 without exposing the substrate to the atmospheric air.

Subsequently, the substrate is transported into the film-forming chamber 110 by the transporting mechanism provided in the transmitting chamber 108, and the cathode (lower layer) 79a formed of an extremely thin inorganic film (a film formed by co-deposition of an alloy such as MgAg, MgIn, AlLi, CaN, or elements belonging to the first or second group of the periodic table and aluminum) is formed by vapor deposition through resistive heating. After the cathode (lower layer) 79a of a thin metal layer is formed, the substrate is transported into the film-forming chamber 109, and the cathode (upper layer) 79b of a transparent oxide conductive coating (ITO (Indium Oxide-Tin Oxide Alloy), Indium Oxide-Zinc Oxide Alloy (In2O3-ZnO), Zinc Oxide (ZnO) and so on) is formed by the spatter method, so that the cathodes 79a and 79b respectively of a laminated layer including a thin metallic layer and a transparent conductive layer may be formed as appropriate. Although the layer that functions as the cathode of the light-emitting diode is the thin metallic layer, the laminated film including the thin metallic layer and a transparent conductive coating is referred to as the cathode in this specification.

The light-emitting diode of laminated structure shown in FIG. 7C is formed according to the process described thus far. The light emitting diode of laminated structure shown in FIG. 7C emits light in the direction indicated by the arrow in the figure, and it is the opposite direction from the light-emitting diode shown in FIG. 3B.

Since the process from this onward is the same as the process of manufacturing the light-emitting device having laminated structure shown in FIG. 3A, it will not be described here.

As described thus far, with the manufacturing apparatus shown in FIG. 8, the laminated structures shown in FIG. 3B and FIG. 7C may be differentiated.

This example may be combined with any one of the first to fourth embodiments as desired.

Example 2

Figure 9:
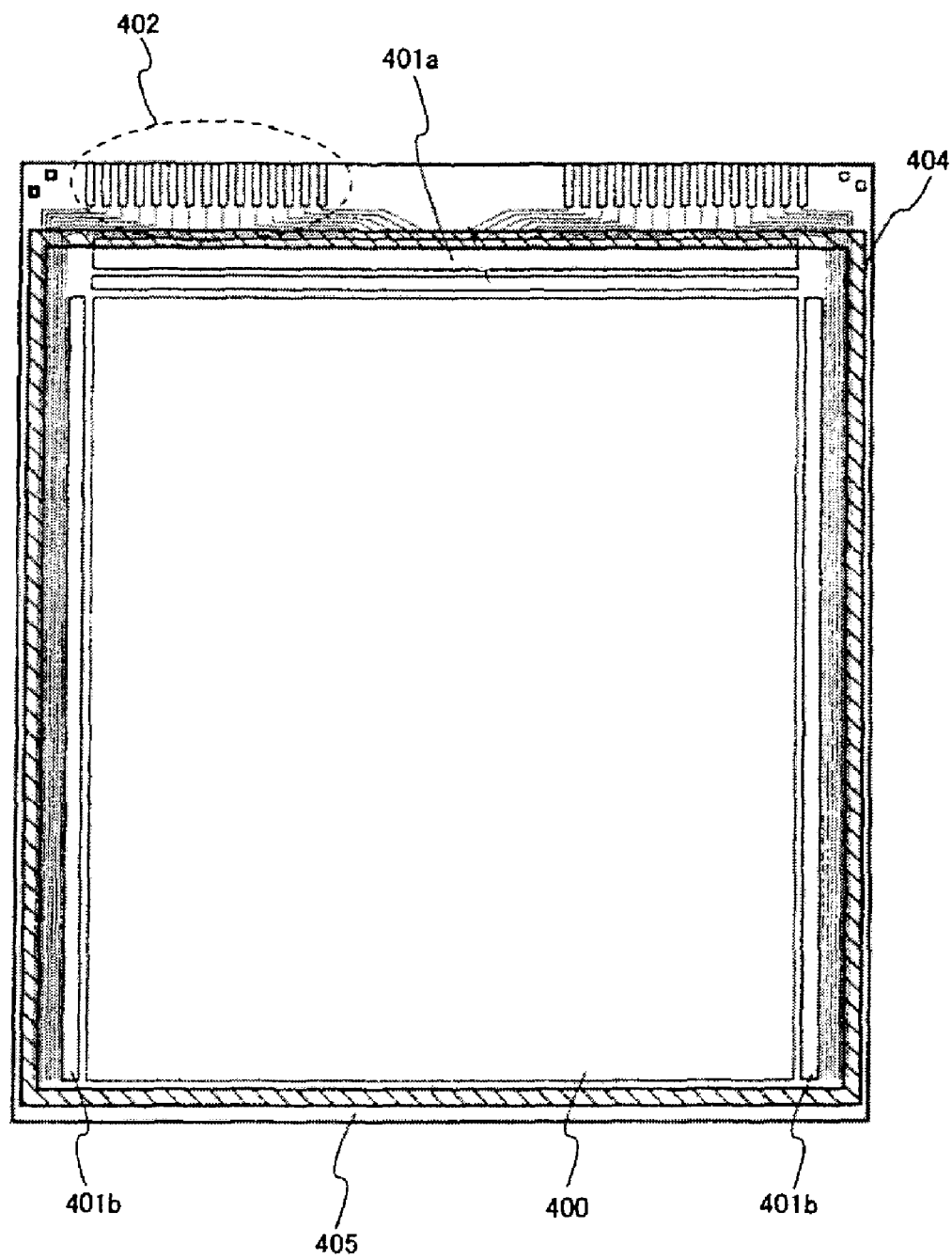
FIG. 9 is a top view of a light-emitting device (example 2)

FIG. 9 is an externals of a top view of an EL module. In the figure, over a substrate (also referred to as TFT substrate) 405 where a number of TFTs are provided, there are formed a pixel portion 400 used for display, driver circuits 401a and 401b for driving pixels of the pixel portion, a connecting portion for connecting an electrode formed on an EL layer and a lead wiring, and a terminal portion 402 to which an FPC is attached for connecting an external circuit therewith. Also, a substrate 406 for sealing an organic light emitting device and a sealing member 404 are used to attain a sealed state.

The cross-sectional drawing of FIG. 3B has been which applied sealing steps such as a protective film or sealing substrate is assumed to be one example of the cross-section of the pixel portion shown in FIG. 9, however it is not limited particularly.

An insulating film is formed on the substrate and a pixel portion and a driving circuit are formed on the upper side of the insulating film and the pixel portion is formed by a current control TFT and some pixels including a pixel electrode electrically connected with the drain of the current control TFT. The driving circuit is formed by CMOS circuit combined with n-channel TFT and p-channel TFT.

These TFTs may be formed by the steps described below.

For a lower layer of the base insulating film, a silicon oxynitride film formed from $SiH_4$, $NH_3$, and $N_2O$ as material gases (composition ratio: Si=32%, O=27%, N=24%, H=17%) is formed on the heat resistance glass substrate (the first substrate) having a thickness of 0.7 mm with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, for an upper layer of a base insulating film, a silicon hydride oxynitride film formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base insulating film is shown in a form of a two-layer structure, but a single layer of the insulating film containing silicon as its main constituent or a structure in which two or more layers thereof are laminated may be adopted. Further, there is no limitation on the material of the semiconductor film. However, the semiconductor film may be preferably formed of silicon or silicon germanium ($Si_{1-X}Ge_X$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2 \times 10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of the laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm² by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 470 mJ/cm². Note that an oxide film is formed on the surface by the first laser light irradiation since the irradiation is conducted in an atmosphere or in an oxygen atmosphere. Though an example of using the pulse laser is shown here, the continuous oscillation laser may also be used. When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO4 and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm2 (preferably 0.1 to 10 MW/cm2) is required. The semiconductor film is moved at approximately 10 to 2000 cm/s rate relatively corresponding to the laser beams so as to irradiate the semiconductor film.

Though the technique of irradiating laser light is conducted after heat treatment using nickel as a metal element for promoting the crystallization is performed here, crystallization of an amorphous silicon film may be performed by using continuous oscillation layer (the second harmonics of YVO4 laser) without doping nickel.

The oxide film formed by this laser light irradiation and an oxide film formed by treating the surface with ozone water for 120 seconds together make a barrier layer that has a thickness of 1 to 5 nm in total. Though the barrier layer is formed by using ozone water here, another method such as ultraviolet light irradiation performing in an oxygen atmosphere or oxide plasma treatment to oxidize the surface of the semiconductor film having the crystalline structure may be used. In addition, as another method for forming the barrier layer, an oxide film having a thickness of about 1 nm to 10 nm may be deposited by a plasma CVD method, a sputtering method, an evaporation method, or the like. In this specification, the term barrier layer refers to a layer which has a film quality or film thickness that allows a metal element to pass in the gettering step and which functions as an etching stopper in the step of removing the layer that functions as a gettering site.

On the barrier layer, an amorphous silicon film containing argon elements are formed to a thickness of 50 to 400 nm, in this embodiment, 150 nm by sputtering to serve as a gettering site. Film formation conditions by sputtering in this embodiment include setting the film formation pressure to 0.3 Pa, the gas (Ar) flow rate to 50 sccm, the film formation power to 3 kW, and the substrate temperature to 150° C. The amorphous silicon film that is formed under the above conditions contains argon elements in an atomic concentration of $3 \times 10^{20}$ to $6 \times 10^{20}$/cm3, and contains oxygen in an atomic concentration of $1 \times 10^{19}$ to $3 \times 10^{19}$/cm3. Thereafter, an electric furnace is used in heat treatment at 550° C. for 4 hours for gettering to reduce the nickel concentration in the semiconductor film having a crystalline structure. The lamp annealing apparatus may by used instead of the electric furnace.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film is formed. In this embodiment, a silicon oxynitride film (composition ratio: S=32%, O=59%, N=7%, H=2%) is formed with a thickness of 115 nm by plasma CVD.

Next, on the gate insulating film, a first conductive film with a thickness of 20 to 100 nm and a second conductive film with a thickness of 100 to 400 nm are formed in lamination. In this embodiment, a 50 nm thick tantalum nitride film and a 370 nm thick tungsten film are sequentially laminated on the gate insulating film and perform the patterning according to the process described below and then each gate electrodes and each wiring are formed.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

An ICP (Inductively Coupled Plasma) etching method may be preferably used for the etching process of the above-mentioned first and second conductive films (the first and second etching processes). The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. In this embodiment, after the resist mask is formed, RF (13.56 MHz) power of 700 W is applied to the coil-shape electrode with a pressure of 1 Pa as a first etching condition, and CF4, Cl2, and O2 can be appropriately used as etching gases. Each flow rate of gasses is set to 25/25/10 (sccm), and RF (13.56 MHz) power of 150 W is applied also to the substrate (sample stage) to substantially apply a negative self-bias voltage. Note that, size of the electrode area on the substrate side is 12.5 cm×12.5 cm, and coil-shape electrode (a quartz disc comprising a coil is used here) has 25 cm in diameter. With the first etching conditions, a W film is etched to form an end portion of the first conductive layer into a tapered shape. Thereafter, the resist mask is removed and the second etching condition is adopted. CF4 and Cl2 are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which CF4 and Cl2 are mixed, both the W film and the TaN film are etched at the same level. Here, the first etching condition and the second etching condition are referred to as the first etching treatment.

The second etching treatment is performed without removing a resist mask. Here, CF4 and Cl2 are used as etching gases, the flow rate of the gases is set to 30/30 sccm, and RF (13.56 MHz) power of 500 W is applied to a coil-shape electrode with a pressure of 1 Pa to generate plasma, thereby performing etching for about 60 seconds. RF (13.56 MHz) power of 20 W is also applied to the substrate side (sample stage) to substantially apply a negative self-bias voltage. Thereafter, the fourth etching treatment is performed without removing a resist mask, CF4, Cl2, and O2 are used as etching gases, the flow rate of the gases is set to 20/20/20 sccm, and RF (13.56 MHz) power of 500 W is applied to a coil-shape electrode with a pressure of 1 Pa to generate plasma, thereby performing etching for about 20 seconds. RF (13.56 MHz) power of 20 W is also applied to the substrate side (sample stage) to substantially apply a negative self-bias voltage. Here, the third etching condition and the fourth etching condition are referred to as the second etching treatment. At this stage, the gate electrode and electrodes comprised of the first conductive layer as a lower layer and the second conductive layer as an upper layer are formed.

After removing the resist masks, the first doping treatment is conducted to dope using gate electrodes as masks to entire surface. The first doping treatment employs ion doping or ion implantation. In ion doping, the dose is set to $1.5 \times 10^{14}$ atoms/cm2 and the acceleration voltage is set to 60 to 100 keV. Typically, phosphorus (P) or arsenic (As) is used as an impurity element that gives the n-type conductivity. The first impurity regions (n−−region) are formed in a self aligning manner.

Subsequently, new resist masks are formed. The masks are formed to cover the channel formation region or the portion of the semiconductor layer for forming the switching TFT of the pixel portion to reduce the off-state current of the switching TFT. The masks are formed to protect the channel formation region or the portion of the semiconductor layer for forming the p-channel TFT of the driving circuit or the periphery portion thereof. In addition, masks are formed to cover the channel formation region of the semiconductor layer for forming the current control TFT 404 of the pixel portion or the periphery portion thereof.

Next, the impurity region (n− region) overlapping with a part of the gate electrode by performing selectively the second doping treatment using above-mentioned resist masks. The second doping processing may be performed by the ion-doping method or the ion-implanting method. In this embodiment, the ion doping method is performed under a condition in a gas flow rate of phosphine (PH3) diluted to 5% with hydrogen of 30 sccm, and the dose of $1.5 \times 10^{14}$ atoms/cm2 and the accelerating voltage of 90 keV. The resist mask and the second conductive film function as mask for the n-type doping impurity element, and the second impurity regions are formed. An n-type doping impurity element in the density range of $1 \times 10^{16}$ to $1 \times 10^{17}$ atoms/cm3 are added to the impurity regions. In this embodiment, the region of same concentration range as the second impurity region is referred to as n− region.

The third doping processing is performed without removing masks made of resist. The third doping processing may be performed by the ion-doping method or the ion-implanting method. As the n-type doping impurity element may be typically used phosphorus (P) or arsenic (As). In this embodiment, the ion doping method is performed under a condition in a gas flow rate of phosphine (PH3) diluted to 5% with hydrogen of 40 sccm, the dose of $2 \times 10^{15}$ atoms/cm2, and the accelerating voltage of 80 kV. In this case, the resist mask, the first conductive layer, and the second conductive layer function as masks for the n-type doping impurity element and the third impurity regions are formed. An n-type doping impurity element in the density range of $1 \times 10^{20}$ to $1 \times 10^{21}$ atoms/cm3 are added to the third impurity regions. In this embodiment, the region of same density range as the third impurity region is referred to as n+ region.

After the resist mask is removed, the mask made from resist is formed to perform the fourth doping treatment. By the fourth doping treatment, the fourth impurity regions and the fifth impurity regions are formed, that is the semiconductor layer forming the semiconductor layer forming the p-channel type TFT in which p-type doping impurity element is added.

A p-type doping impurity element in the density range of $1 \times 10^{20}$ to $1 \times 10^{21}$/cm3 are added to the fourth impurity regions. Note that, in the fourth impurity regions, phosphorous (P) has been added in the preceding step (n−−region), but the p-type doping impurity element is added at a density that is 1.5 to 3 times as high as that of phosphorous. Thus, the fourth impurity regions have a p-type conductivity. In this embodiment, the region of same density range as the fourth impurity region is referred to as p+ region.

The fifth impurity regions are formed to overlap with the taper portion of the second conductive layer, and added with the p-type impurity element in the density range of $1 \times 10^{18}$ to $1 \times 10^{20}$/cm3. In this embodiment, the region of same density range as the fifth impurity region is referred to as p− region.

Though the above-described steps, the impurity regions having n-type or p-type doping impurity element are formed in the respective semiconductor layer. The conductive layers become gate electrodes of TFT.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film is formed of a silicon nitride film, and heat treatment (300 to 550° C. for 1 to 12 hours) is performed, thereby conducting a step of hydrogenating the semiconductor layers. This step is a step of terminating dangling bonds of the semiconductor layers by hydrogen contained in the first interlayer insulating film. The semiconductor layers can be hydrogenated irrespective of the existence of an insulating film (not shown) formed of a silicon oxide film. As another means for hydrogenation, plasma hydrogenation (using hydrogen excited by plasma) may be conducted.

Next, a second interlayer insulating film is formed from an organic insulating material on the first interlayer insulating film. In this embodiment, an acrylic resin film with a thickness of 1.6 μm is formed by a coating method. Further, the silicon nitride film with a thickness of 200 nm is formed by using a sputtering method. In this embodiment, an example of depositing the silicon nitride film on the acrylic resin film with a thickness of 1.6 μm is shown. The material or the thickness of the insulating film are not limited. In the case that a capacity is formed between the gate electrode and the power source current line that is formed on the gate electrode, the thickness of the organic insulating film and the inorganic insulating film may be 0.5 μm to 2.0 μm.

Next, the pixel electrode is formed that contacts to the drain region of the current control TFT including p-channel TFT to contact and overlap with the connection electrode to be formed later. In this embodiment, the pixel electrode functions as an anode of the organic light emitting device, and is a transparent conductive film to pass the light from the organic light emitting device to the pixel electrode.

The contact hole that reaches the conductive layer to be the gate electrode or the gate wiring, and the contact hole that reach each impurity region. In this embodiment, the plural etching treatments are performed sequentially. In this embodiment, the third interlayer insulating film is etched using the second interlayer insulating film as an etching stopper, and the first interlayer insulating film is etched after the second interlayer insulating film is etched using the first interlayer insulating film as the etching stopper.

Thereafter, the electrodes are formed by using Al, Ti, Mo, W and the like. Specifically, a source wiring, a power source supply line, an extraction electrode, and a connection electrode are formed. As the material of the electrodes and the wirings, a lamination film having Al film (350 nm thickness) including Ti film (110 nm thickness) and silicon, and Ti film (50 nm thickness) is used. And patterning is performed. Thus, the source electrode, the source wiring, the connection electrode, the extraction electrode, and the power source supply line are formed appropriately. Further, the extraction electrode for contacting with the gate wiring overlapped with the interlayer insulating film is provided in the edge portion of the gate wiring. The input-output terminal portion in which the plural electrodes for connecting with an external circuit and an external power source is provided are formed in other edge portions of each wiring. The connection electrode to contact and overlap with the pixel electrode that is formed previously contacts with the drain region of the current control TFT.

As described above, a driving circuit having an n-channel TFT, a p-channel TFT, and a CMOS circuit that combines complementary the n-channel TFT and a p-channel TFT, and a pixel portion provided with the plural n-channel TFTs or the plural p-channel TFTs in one pixel is formed.

Further, the pixel electrode functions as an anode of the organic light emitting element. The insulators referred to as banks are formed to overlap with the edge portion of the pixel electrode and the organic compound layer and a cathode of the light emitting element are formed on the pixel electrode.

The cathode also functions as a wiring connected in common to all the pixels. The cathode is electrically connected to the terminal connected to FPC via connection wiring. All the device contained in the pixel portion and the gate driver circuit are covered with the cathode and a protective film. A covering member (the substrate to seal) and the substrate may be bonded together by an adhesive. A depression may be formed in the covering member to accommodate a desiccant.

Example 3

Figure 10:
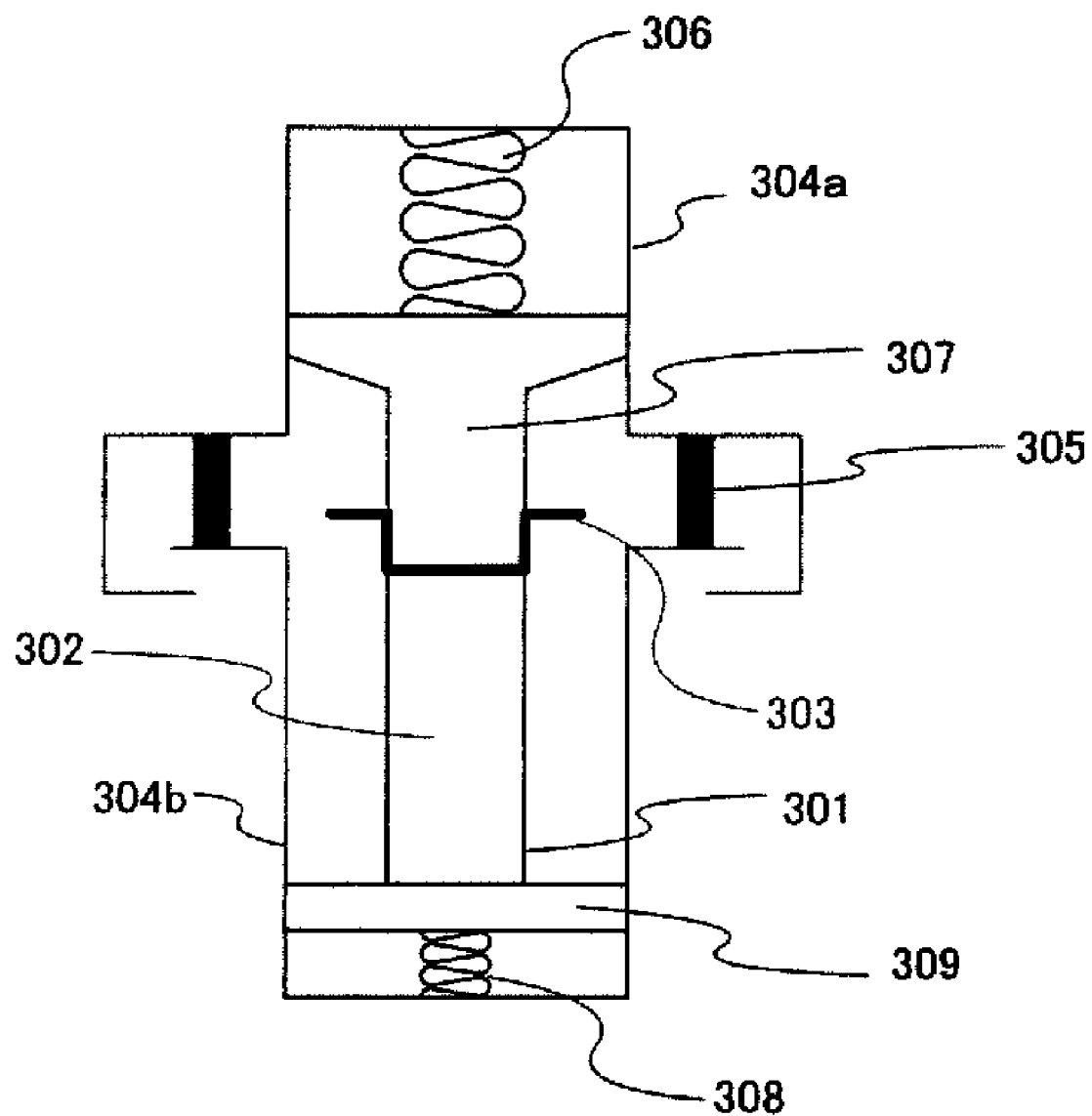
FIG. 10 is a drawing showing a third example.

An example of the second container described in conjunction with the third embodiment is shown in FIG. 10 in the present embodiment.

FIG. 10 is a cross sectional view of the second container in which the first container is stored.

In FIG. 10, reference numeral 301 designates a first container, typically, a melting pot, in which EL material 302 is stored. The melting pot 301 is adapted to be closed loosely by a melting pot lid 303. The second container includes two parts, an upper part 304a and a lower part 304b, that are hermetically closed by an O-ring 305. The upper part 304a is provided with a spring 306, so that an upper lid 307 is capable of moving. The lower part 304b is also provided with a spring 308, so that a lower lid 309 is capable of moving. The melting pot 301 is interposed between the upper lid 307 and the lower lid 309. The lower lid 309 is formed with a projection (not shown) for fixing the melting pot 301, and the melting pot lid 303 is adapted to be held by the upper lid 307. The melting pot lid and the upper lid may be formed integrally.

The second containers 304a, 304b are filled with inert gas (typically nitrogen).

When the second container is placed in the vacuumable process chamber and a vacuum is formed in the process chamber, the upper part 304a of the second container comes off by a force of restitution of the spring because of the difference between the inner pressure and the outer pressure. Accordingly, the melting pot 301 is pushed out by the force of restitution of the spring. In this manner, the second container shown in FIG. 10 is a container that can be opened relatively easily by forming a vacuum from the atmospheric pressure. Therefore, the operation after it is opened, for example, the operation for removing the upper part 304a or the melting pot lid 303 or the operation to take out the first container may be performed by a robot or the like. The second container shown in FIG. 10 may be a container that is shock resistant and hence suitable to the transportation.

This example may be combined with any one of the first to fourth embodiments, the example 1 and the example 2 as desired.

Example 4

The modules (active matrix EL module) having the organic light emitting devices can be completed by implementing the present invention. Namely, all of the electronic equipments are completed by implementing the present invention.

Following can be given as such electronic equipments: video cameras; digital cameras; head mounted displays (goggle type displays); car navigation systems; projectors; car stereos; personal computers; portable information terminals (mobile computers, cell phones or electronic books etc.) etc. Examples of these are shown in FIG. 11A to FIG. 11F and FIG. 12A to FIG. 12C.

Figure 11A:
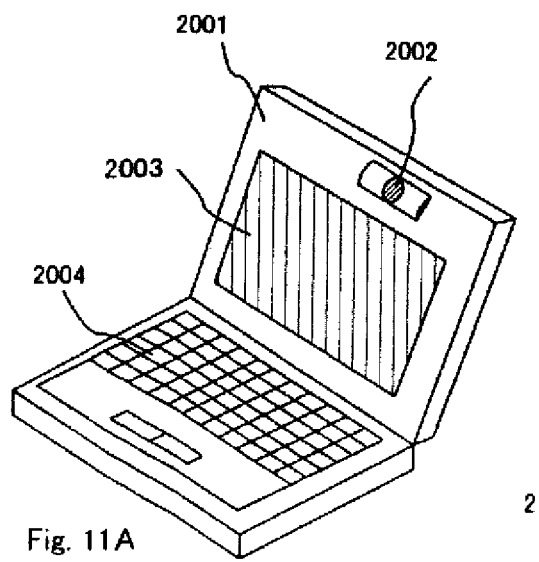
FIGS. 11A to 11F are drawings showing an example of the electronic equipment.

FIG. 11A is a personal computer which comprises: a main body 2001; an image input section 2002; a display section 2003; and a keyboard 2004 etc.

Figure 11B:
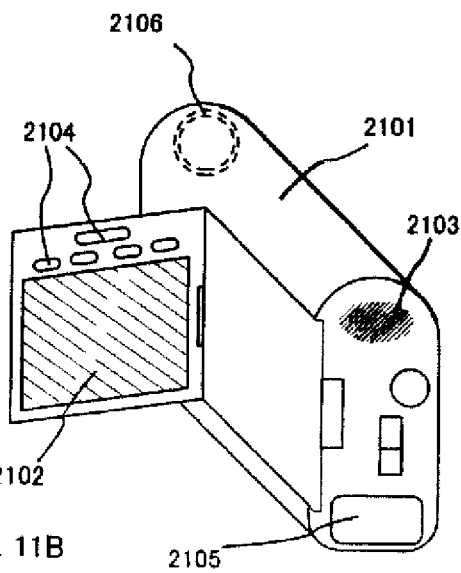

FIG. 11B is a video camera which comprises: a main body 2101; a display section 2102; a voice input section 2103; operation switches 2104; a battery 2105 and an image receiving section 2106 etc.

Figure 11C:
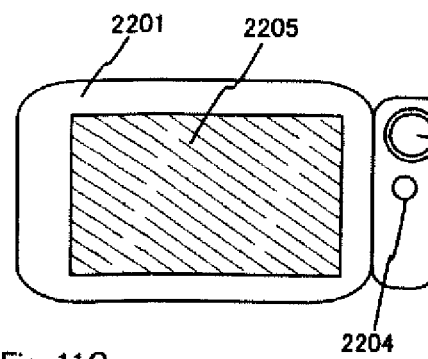

FIG. 11C is a mobile computer which comprises: a main body 2201; a camera section 2202; an image receiving section 2203; operation switches 2204 and a display section 2205 etc.

Figure 11D:
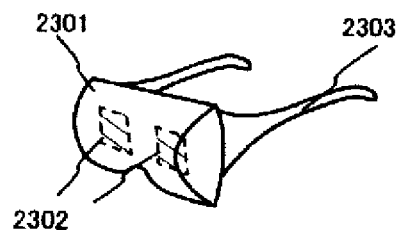

FIG. 11D is a goggle type display which comprises: a main body 2301; a display section 2302; and an arm section 2303 etc.

Figure 11E:
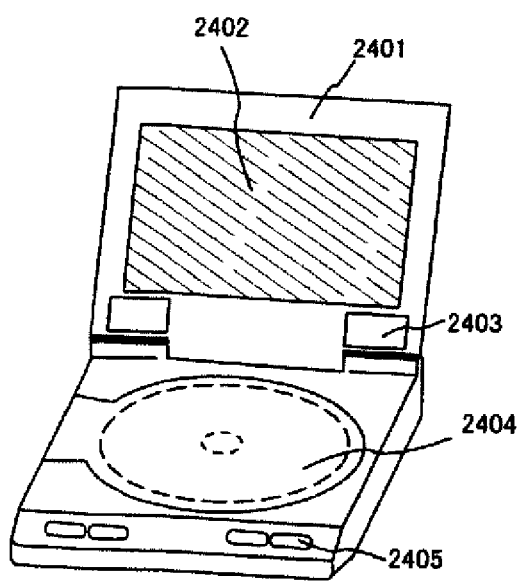

FIG. 11E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (Digital Versatile Disc), CD, etc. for the recording medium, and can perform music appreciation, film appreciation, games and use for Internet.

Figure 11F:
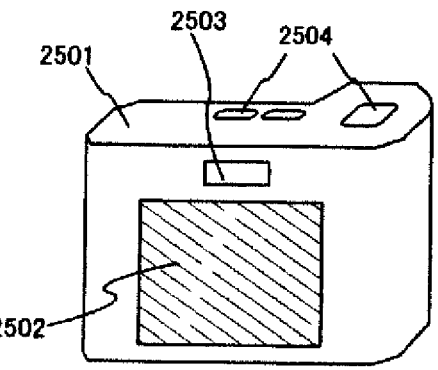

FIG. 11F is a digital camera which comprises: a main body 2501; a display section 2502; a view finder 2503; operation switches 2504; and an image receiving section (not shown in the figure) etc.

Figure 12A:
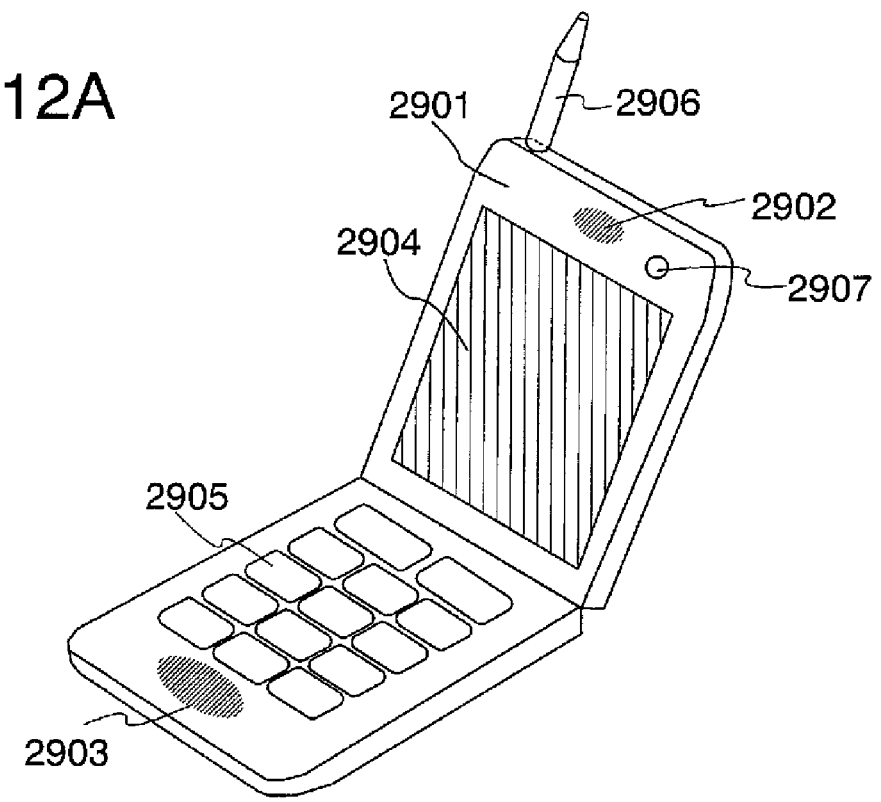
FIGS. 12A to 12C are drawings showing an example of the electronic equipment.

FIG. 12A is a cell phone which comprises: a main body 2901; a voice output section 2902; a voice input section 2903; a display section 2904; operation switches 2905; an antenna 2906; and an image input section (CCD, image sensor, etc.) 2907 etc.

Figure 12B:
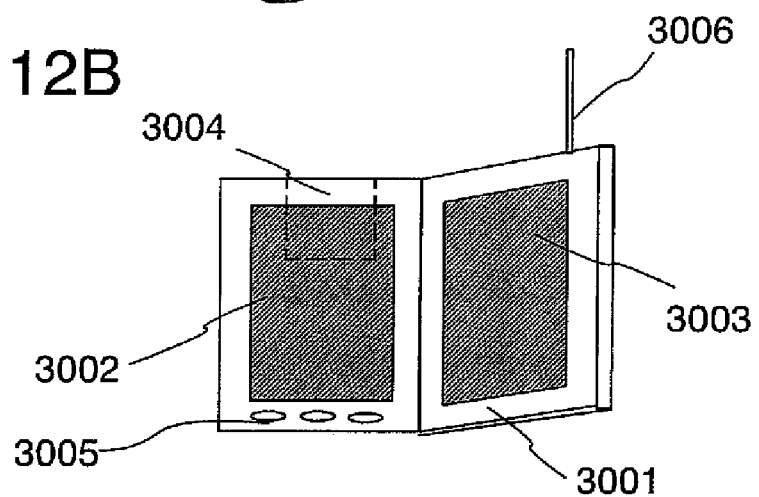

FIG. 12B is a portable book (electronic book) which comprises: a main body 3001; display sections 3002 and 3003; a recording medium 3004; operation switches 3005 and an antenna 3006 etc.

Figure 12C:
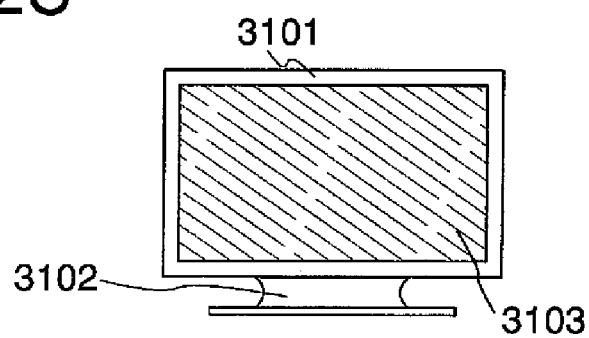
Figure 14A:
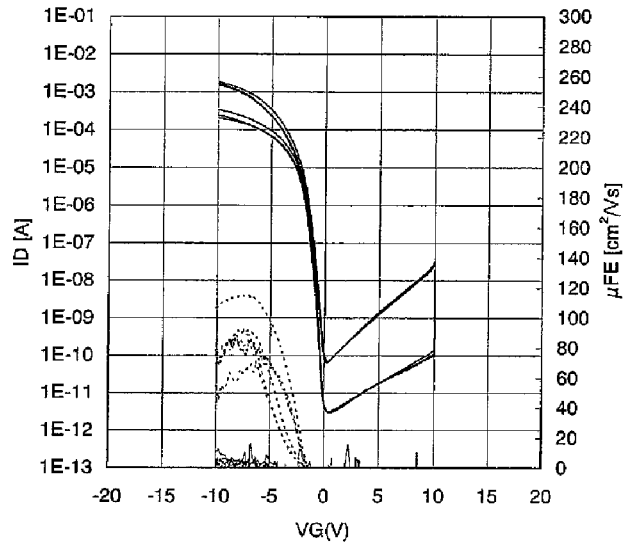
FIGS. 14A and 14B are drawings showing the characteristics of the TFT (comparative example).
Figure 14B:
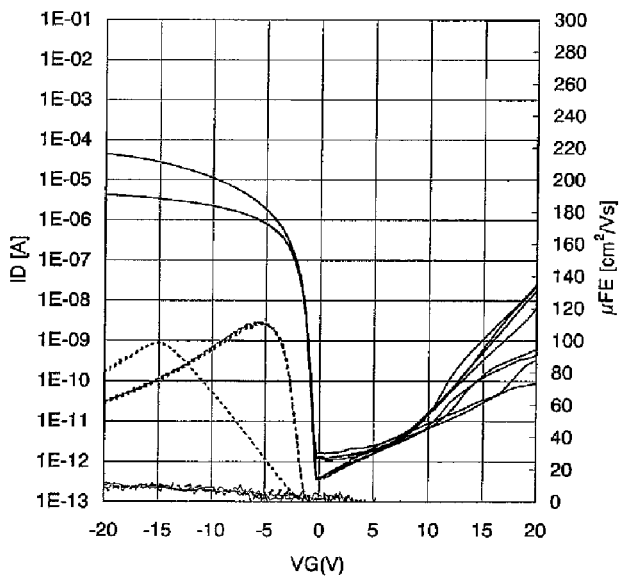

FIG. 12C is a display which comprises: a main body 3101; a supporting section 3102; and a display section 3103 etc.

In addition, the display shown in FIG. 12C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to the manufacturing method of electronic equipments of various areas. Note that the electronic devices of this embodiment can be achieved by utilizing any combination of constitutions in Embodiment Modes 1 to 4, Embodiment for 3.

According to the invention, an active matrix light-emitting device provided with a light-emitting element, which has superior TFT characteristics (ON current, OFF current, Vth, S-value, and so on) may be manufactured.

What is claimed is:

1. A light-emitting device comprising:
a first thin film transistor provided in a pixel portion over a substrate;
second and third thin film transistors provided in a portion outside the pixel portion over the substrate;
a first electrode electrically connected to the first thin film transistor;
an insulating film comprising an organic insulating material formed over the first thin film transistor, the insulating film covering an end of the first electrode;
an organic compound layer formed over the first electrode; and
a second electrode formed over the organic compound layer and the second thin film transistor,
wherein the second thin film transistor is overlapped with the second electrode, and
wherein the third thin film transistor is not overlapped with the second electrode.

2. A light-emitting device comprising:
a first thin film transistor provided in a pixel portion over a substrate;
second and third thin film transistors provided in a portion outside the pixel portion over the substrate;
a first electrode electrically connected to the first thin film transistor;
an insulating film comprising an organic insulating material formed over the first, second and third thin film transistors, the insulating film covering an end of the first electrode;
an organic compound layer formed over the first electrode; and
a second electrode formed over the organic compound layer and the insulating film,
wherein the second thin film transistor is overlapped with the insulating film and the second electrode, and
wherein the third thin film transistor is overlapped with the insulating film and is not overlapped with the second electrode.

3. A light-emitting device comprising:
a first thin film transistor provided in a pixel portion over a substrate;
second and third thin film transistors provided in a portion outside the pixel portion over the substrate;
a first electrode electrically connected to the first thin film transistor;
an insulating film comprising an organic insulating material formed over the first thin film transistor, the insulating film covering an end of the first electrode;
an organic compound layer formed over the first electrode; and
a second electrode formed over the organic compound layer and the second thin film transistor,
wherein the second thin film transistor is overlapped with the second electrode,
wherein the third thin film transistor is not overlapped with the second electrode, and
wherein the second electrode comprises a lower layer formed of a first material and an upper layer formed of a second material which is different from the first material.

4. A light-emitting device comprising:
a first thin film transistor provided in a pixel portion over a substrate;
second and third thin film transistors provided in a portion outside the pixel portion over the substrate;
a first electrode formed over and electrically connected to the first thin film transistor;
an insulating film comprising an organic insulating material formed over the first, second and third thin film transistors, the insulating film covering an end of the first electrode;
an organic compound layer formed over the first electrode; and
a second electrode formed over the organic compound layer and the insulating film,
wherein the second thin film transistor is overlapped with the insulating film and the second electrode,
wherein the third thin film transistor is overlapped with the insulating film and is not overlapped with the second electrode, and
wherein the second electrode comprises a lower layer formed of a first material and an upper layer formed of a second material which is different from the first material.

5. The light-emitting device according to claim 1, wherein the second electrode is a thin film formed of MgAg.

6. The light-emitting device according to claim 2, wherein the second electrode is a thin film formed of MgAg.

7. The light-emitting device according to claim 1, wherein the second and third thin film transistors are provided in a driver circuit.

8. The light-emitting device according to claim 2, wherein the second and third thin film transistors are provided in a driver circuit.

9. The light-emitting device according to claim 3, wherein the second and third thin film transistors are provided in a driver circuit.

10. The light-emitting device according to claim 4, wherein the second and third thin film transistors are provided in a driver circuit.

11. An electronic equipment having the light-emitting device according to claim 1, wherein the electronic equipment is one selected from the group consisting of a video camera, a digital camera, a goggle type display, a car navigation system, a projector, a car stereo, a personal computer, a mobile computer, a cell phone and an electronic book.

12. An electronic equipment having the light-emitting device according to claim 2, wherein the electronic equipment is one selected from the group consisting of a video camera, a digital camera, a goggle type display, a car navigation system, a projector, a car stereo, a personal computer, a mobile computer, a cell phone and an electronic book.

13. An electronic equipment having the light-emitting device according to claim 3, wherein the electronic equipment is one selected from the group consisting of a video camera, a digital camera, a goggle type display, a car navigation system, a projector, a car stereo, a personal computer, a mobile computer, a cell phone and an electronic book.

14. An electronic equipment having the light-emitting device according to claim 4, wherein the electronic equipment is one selected from the group consisting of a video camera, a digital camera, a goggle type display, a car navigation system, a projector, a car stereo, a personal computer, a mobile computer, a cell phone and an electronic book.

15. The light-emitting device according to claim 1, wherein the second and the third thin film transistors are provided around the pixel portion.

16. The light-emitting device according to claim 2, wherein the second and the third thin film transistors are provided around the pixel portion.

17. The light-emitting device according to claim 3, wherein the second and the third thin film transistors are provided around the pixel portion.

18. The light-emitting device according to claim 4, wherein the second and the third thin film transistors are provided around the pixel portion.

19. The light-emitting device according to claim 1, wherein the first electrode is formed over the first thin film transistor.

20. The light-emitting device according to claim 2, wherein the first electrode is formed over the first thin film transistor.

21. The light-emitting device according to claim 3, wherein the first electrode is formed over the first thin film transistor.

22. The light-emitting device according to claim 4, wherein the first electrode is formed over the first thin film transistor.

* * * * *